US011901881B1

(12) United States Patent
Narayanasamy

(10) Patent No.: US 11,901,881 B1
(45) Date of Patent: Feb. 13, 2024

(54) CIRCUIT AND SYSTEM FOR THE REDUCTION OF VOLTAGE OVERSHOOT IN POWER SWITCHES

(71) Applicant: TEXAS INSTRUMENTS INCORPORATED, Dallas, TX (US)

(72) Inventor: Navaneeth Kumar Narayanasamy, Sugarland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/820,424

(22) Filed: Aug. 17, 2022

(51) Int. Cl.
*H02M 1/08* (2006.01)
*H03K 17/08* (2006.01)
*H03K 17/60* (2006.01)
*H03K 17/28* (2006.01)
*H03K 17/06* (2006.01)

(52) U.S. Cl.
CPC .............. *H03K 17/08* (2013.01); *H02M 1/08* (2013.01); *H03K 17/06* (2013.01); *H03K 17/28* (2013.01); *H03K 17/60* (2013.01)

(58) Field of Classification Search
CPC ......... H02M 1/08; H03K 17/06; H03K 17/08; H03K 17/28; H03K 17/60
See application file for complete search history.

(56) References Cited

U.S. PATENT DOCUMENTS

| 2012/0218009 A1* | 8/2012 | Takemae | .......... H03K 17/08122 327/109 |
| 2013/0107584 A1* | 5/2013 | Li | .......... H03K 17/166 363/21.12 |
| 2013/0135775 A1* | 5/2013 | Yao | .......... H02M 1/08 361/18 |
| 2013/0279209 A1* | 10/2013 | Zheng | .......... H03K 17/163 363/21.12 |
| 2022/0224217 A1* | 7/2022 | Liu | .......... H02M 1/08 |

* cited by examiner

*Primary Examiner* — William Hernandez
(74) *Attorney, Agent, or Firm* — Brian D. Graham; Frank D. Cimino

(57) ABSTRACT

An electronic circuit for controlling a power switch having a gate input, includes a signal generator configured to generate a gate driver input signal. The gate driver input signal has a first voltage during a first period of time, a second voltage during a second period of time, and toggles between the first voltage and the second voltage during a third period of time. The electronic circuit also includes a gate driver configured to receive the gate driver input signal and to provide a gate driver output signal based on the gate driver input signal. The signal generator is configured to cause the gate driver input signal to toggle during the third period of time such that the gate driver output signal has a third voltage during the second period of time, and an intermediate voltage that is less than the third voltage during the third period of time.

20 Claims, 20 Drawing Sheets

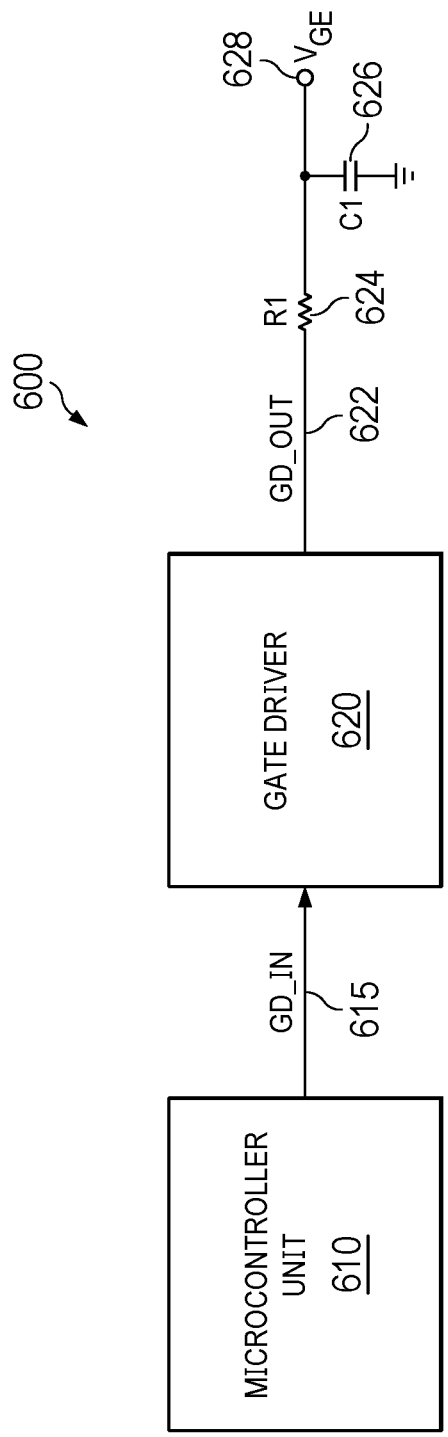

CIRCUIT AND SYSTEM FOR THE REDUCTION OF VOLTAGE OVERSHOOT IN POWER SWITCHES

TECHNICAL BACKGROUND

Power modules are used in a large variety of applications including inverters, DC-DC converters, motor drives, power supplies, uninterruptable power supplies (UPS), and the like. These power modules are often constructed with power switches such as Insulated Gate Bipolar Transistors (IGBT) configured as a single half bridge or multiple half bridge inverters. IGBT power modules have parasitic inductances inherent in their constructions. These inductances are found in bond wires, package pins, metal patterns, soldering, and the like. When power switches are shut off very quickly, such as during an over current fault condition, these parasitic inductances create transient voltages within the power module. In some cases, these transient voltages are sufficient to physically damage the power switches.

OVERVIEW

In an implementation, an electronic circuit for controlling a power switch having a gate input includes a signal generator configured to generate a gate driver input signal. The gate driver input signal has a first voltage during a first period of time, a second voltage during a second period of time, and toggles between the first voltage and the second voltage during a third period of time.

The electronic circuit also includes a gate driver configured to receive the gate driver input signal and to provide a gate driver output signal to the gate input of the power switch based on the gate driver input signal. The signal generator is configured to cause the gate driver input signal to toggle during the third period of time such that the gate driver output signal has a third voltage during the second period of time, and an intermediate voltage that is less than the third voltage during the third period of time.

In another implementation, a microcontroller unit for controlling a power switch having a gate input includes a signal generator configured to generate a gate driver input signal. The gate driver input signal has a first voltage during a first period of time, a second voltage during a second period of time, and toggles between the first voltage and the second voltage during a third period of time.

The gate driver input signal, when provided to a gate driver causes the gate driver to provide a gate driver output signal to the gate input of the power switch based on the gate driver input signal. The signal generator is further configured to cause the gate driver input signal to toggle during the third period of time such that the gate driver output signal has a third voltage during the second period of time, and an intermediate voltage that is less than the third voltage during the third period of time.

In a further embodiment, a method for using a microcontroller unit to control a power switch having a gate input includes generating a gate driver input signal. The gate driver input signal has a first voltage during a first period of time, a second voltage during a second period of time, and toggles between the first voltage and the second voltage during a third period of time.

The method also includes providing the gate driver input signal to a gate driver causing the gate driver to produce a gate driver output signal based on the gate driver input signal, and providing the gate driver output signal to the gate input of the power switch.

The gate driver input signal toggles during the third period of time such that the gate driver output signal has a third voltage during the second period of time, and an intermediate voltage that is less than the third voltage during the third period of time.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

FIG. 6A illustrates an example embodiment of a circuit designed to provide a two-level turn-off to a power module.

DETAILED DESCRIPTION

The following descriptions of various example embodiments and implementations of an electronic circuit for controlling a power switch illustrate systems and methods for reducing overshoot in a power switch when the switch is being shut down, such as during a fault. In these various examples a signal generator is configured to provide a gate driver input to a gate driver configured to drive the gate input of a power switch. In some examples, the signal generator includes first and second pulse width modulators (PWMs). A signal from the first PWM controls the gate driver during normal operation, and during a shut down the second PWM generates a higher frequency signal for combination with the signal from the first PWM such that the combined signal causes the gate driver output to provide an intermediate voltage to the gate input of the power switch while the second PWM is active.

By providing this intermediate voltage to the gate input of the power switch for a period of time during shutdown, overshoots due to parasitic inductances are reduced, preventing damage to the power switch. The various embodiments and implementations described herein provide a technical effect and technical advantage over other similar systems by providing the intermediate voltage using a less complex (inexpensive) gate driver rather than the complex (expensive) gate drivers able to produce the intermediate voltage on their own.

These complex gate drivers provide for setting the intermediate voltage with an external diode and capacitor. In some examples, complex gate drivers use a digital communication interface to set the intermediate voltage. In contrast, the present embodiments remove the need for these external components or interfaces and allow for the use of a less complex, less expensive gate driver. Since six gate drivers are used in many three-phase power converters, the cost and area savings from the elimination of the external diode and capacitor, and the replacement of a complex (expensive) gate driver with a less complex (less expensive) gate driver, is multiplied six-fold, providing a significant technical advantage over other solutions.

Figure 1:
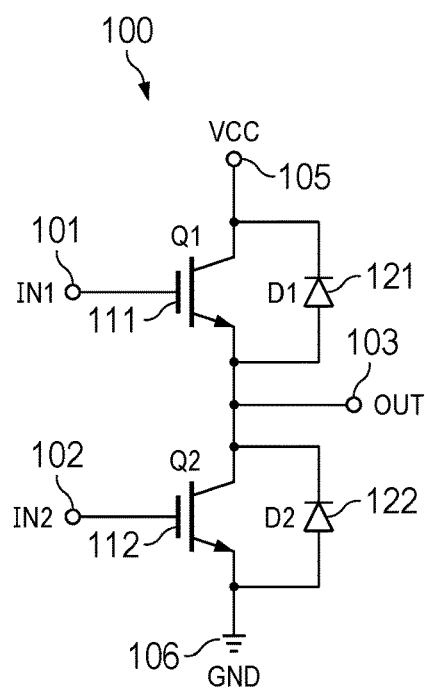
FIG. 1 illustrates an example embodiment of an ideal half-bridge insulated gate bipolar transistor (IGBT) module.

FIG. 1 illustrates an example embodiment of an ideal half-bridge insulated gate bipolar transistor (IGBT) module 100. In this embodiment, a half-bridge IGBT module 100 includes two IGBTs Q1 111 and Q2 112, along with two diodes D1 121 and D2 122. Power is supplied by power supply VCC 105 and a ground 106 is also provided. IGBT Q1 111 has a gate input IN1 101 and IGBT Q2 112 has a gate input IN2 102. The output 103 of the module is at the node connecting the emitter of Q1 111 with the collector of Q2 112.

Figure 2:
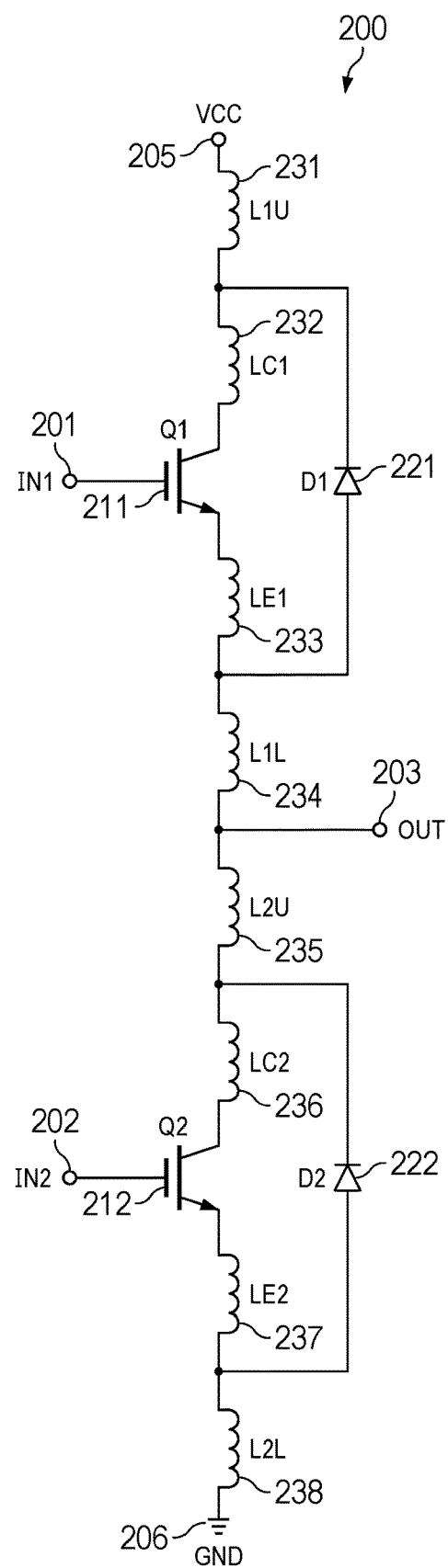
FIG. 2 illustrates an example embodiment of a half-bridge insulated gate bipolar transistor (IGBT) module including parasitic inductances.

FIG. 2 illustrates an example embodiment of a half-bridge insulated gate bipolar transistor (IGBT) module 200 including parasitic inductances. As discussed above, FIG. 1 is an idealized representation of a half-bridge IGBT module. In reality a number of parasitic inductances are actually present, both inherent in the devices, and due to package and board inductances. FIG. 2 illustrates the power module of FIG. 1 including these parasitic inductances.

In this embodiment, half-bridge IGBT module 200 includes two IGBTs Q1 211 and Q2 212, along with two diodes D1 221 and D2 222. Power is supplied by VCC 205 and a ground 206 is also provided. IGBT Q1 211 has a gate input IN1 201 and IGBT Q2 212 has a gate input IN2 202. The output 203 of the module is at a node connecting the emitter of Q1 211 with the collector of Q2 212 through parasitic inductors.

In this example, eight parasitic inductors are illustrated. Inductor L1U 231 represents inductance between VCC 205 and the cathode of diode D1 221. Inductor LC1 232 represents inductance between the cathode of diode D1 221 and the collector of IGBT Q1 211. Inductor LE1 233 represents inductance between the emitter of IGBT Q1 211 and the anode of diode D1 221. Inductor L1L represents inductance between the anode of diode D1 221 and the output 203. Inductor L2U represents inductance between the output 203 and the cathode of diode D2 222. Inductor LC2 236 represents inductance between the cathode of diode D2 222 and the collector of IGBT Q2 212. Inductor LE2 237 represents inductance between the emitter of IGBT Q2 212 and the anode of diode D2 222. Inductor L2L represents inductance between the anode of diode D2 222 and ground 206.

Note that this illustration is one possible representation of parasitic inductances found in a half-bridge IGBT module. Other embodiments may have some or all of these inductances, or other inductances not illustrated here depending on their design and construction.

Together these parasitic inductances cause transient voltages during switching of the IGBTs. The transient voltage may be calculated with the following equation:

$$\Delta V = -L_\delta \times \frac{di_{L_\delta}}{dt}$$

where $\Delta V$ is the transient voltage, $L_\delta$ is the parasitic inductance and $$\frac{di_{L_\delta}}{dt}$$

is the rate of current change within the parasitic inductance.

During overcurrent fault conditions, di/dt can be very high and in some cases may exceed the voltage limit of $V_{CE}$ (voltage across the collector to emitter) in the switch and subsequently damage the IGBT. An example of this overshoot is illustrated in FIG. 3.

Figure 3:
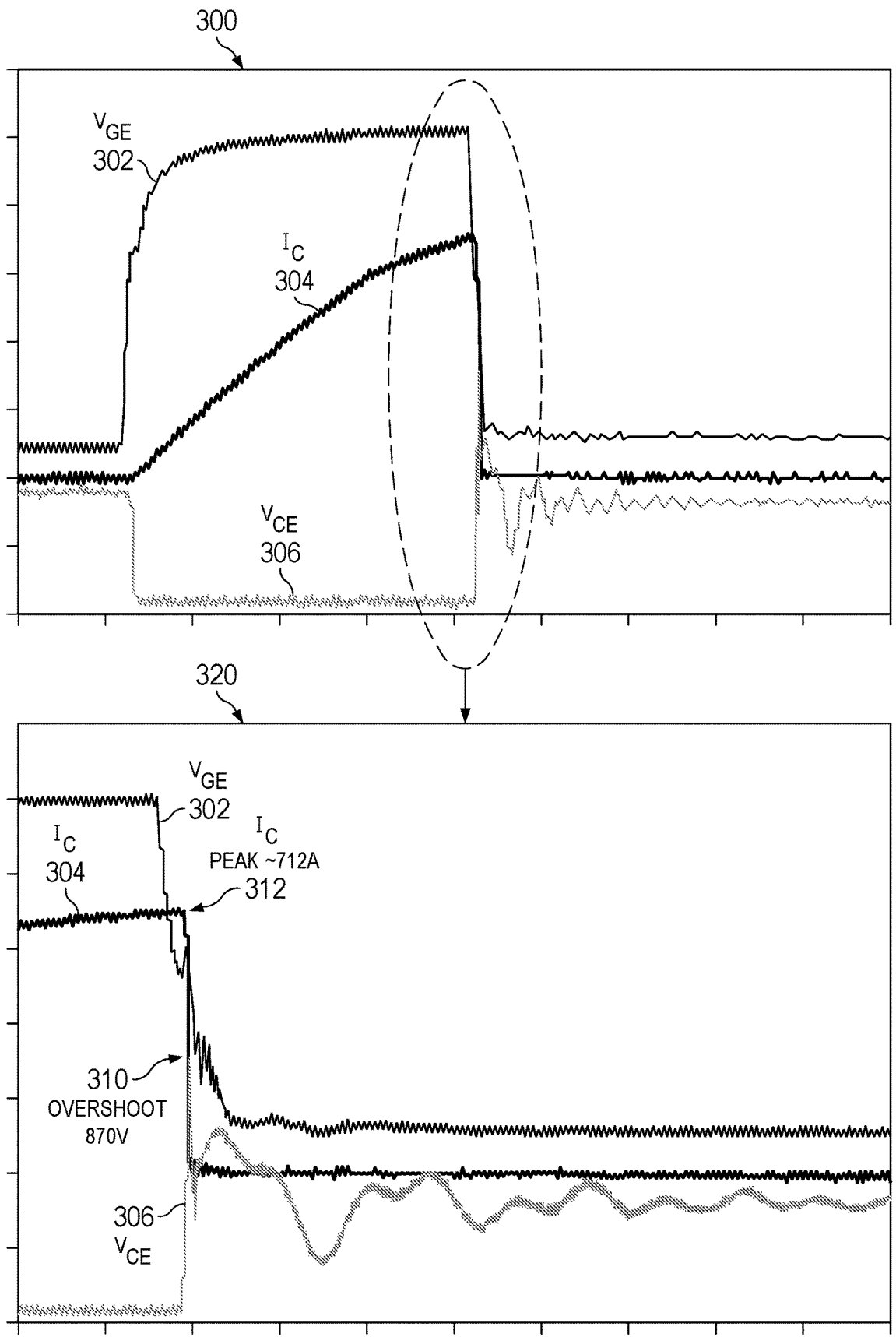
FIG. 3 illustrates an output of a simulation demonstrating transient voltages on a power module output due to parasitic inductances.

FIG. 3 illustrates an output 300 of a simulation demonstrating transient voltages on a power module output due to parasitic inductances, along with an expanded view 320 of the transitions. In this example simulation, the input 302 to an IGBT (the voltage across the gate to emitter ($V_{GE}$) of the IGBT), the collector current ($I_C$) 304 of the IGBT, and the output voltage 306. In some examples, the output voltage is also the voltage across the collector to emitter ($V_{CE}$) of the IGBT. In this example $V_{CC}$ is set to 400V DC and the IGBT is rated for 600V.

In this simulation, the input 302 is suddenly shut off, and when the voltage across the gate to emitter ($V_{GE}$) drops below the threshold voltage of the IGBT, the collector current ($I_C$) 304 drops, and the output 306 voltage sharply rises to an 870-volt peak 310 and a peak collector current ($I_C$) of about 712 amps 312 that falls to zero in approximately 1.75 usec. This 470-volt overshoot 310 above the 400V supply voltage (for a total of 870V) may be sufficient to damage IGBTs rated for 600V. In other examples, these values vary depending on the system design and use case.

Figure 4:
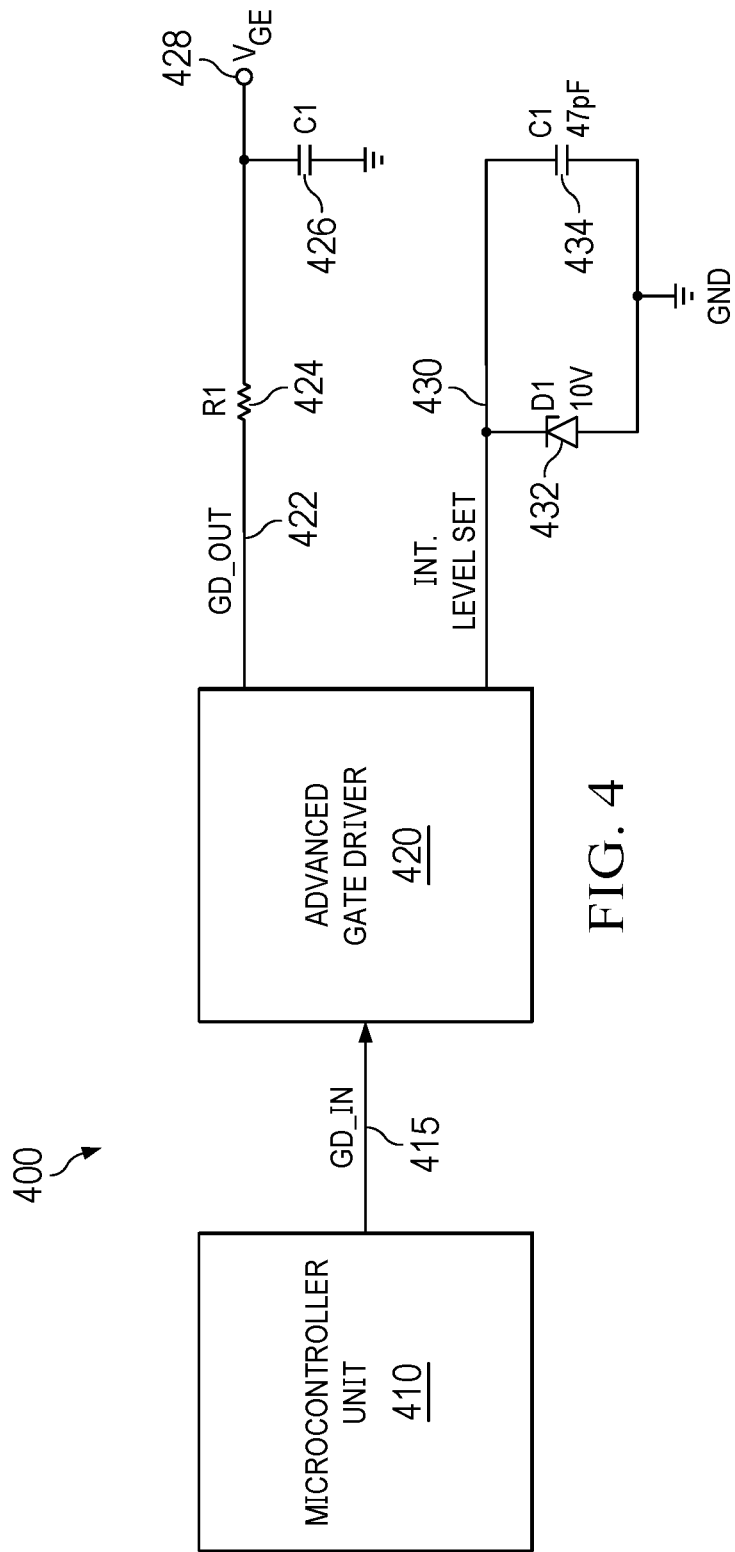
FIG. 4 illustrates a prior art example embodiment of a circuit designed to provide a two-level turn-off to a power module.

FIG. 4 illustrates a prior art example embodiment of a circuit 400 designed to provide a two-level turn-off to a power module. In order to prevent the damaging overshoot illustrated in FIG. 3, advanced gate drivers 420 may be used to provide a two-level turn-off to the gate of the IGBT. A two-level turn-off is when, while shutting off the gate, the gate driver applies an intermediate voltage to the gate for a quantity of time, before completely turning off the gate. This intermediate voltage is designed to be less than the normal high voltage applied to turn on the gate, and greater than the normal low voltage applied to turn off the gate. This is further illustrated in FIG. 6B and described below.

In this example, microcontroller unit 410 controls advanced gate driver 420 to provide a two-level turn-off to an IGBT. Microcontroller unit 410 provides input signal GD_IN 415 to advanced gate driver 420. The intermediate voltage of the two-level turn-off is set by diode D1 432 and capacitor C1 434 at input Intermediate Level Set 430. In this example diode D1 432 is a 10V diode, and capacitor C1 434 is a 47 pF capacitor. In this embodiment, a resistor R1 424 is connected between the output of advanced gate driver 420, GD_OUT 422, and the gate input ($V_{GE}$) 428 of the power switch. R1 424 is configured, in combination with capacitance C1 426 of the power switch, to add a resistor-capacitor (RC) time constant to GD_OUT 422 provided to the gate input of the power switch, $V_{GE}$ 428.

Figure 5:
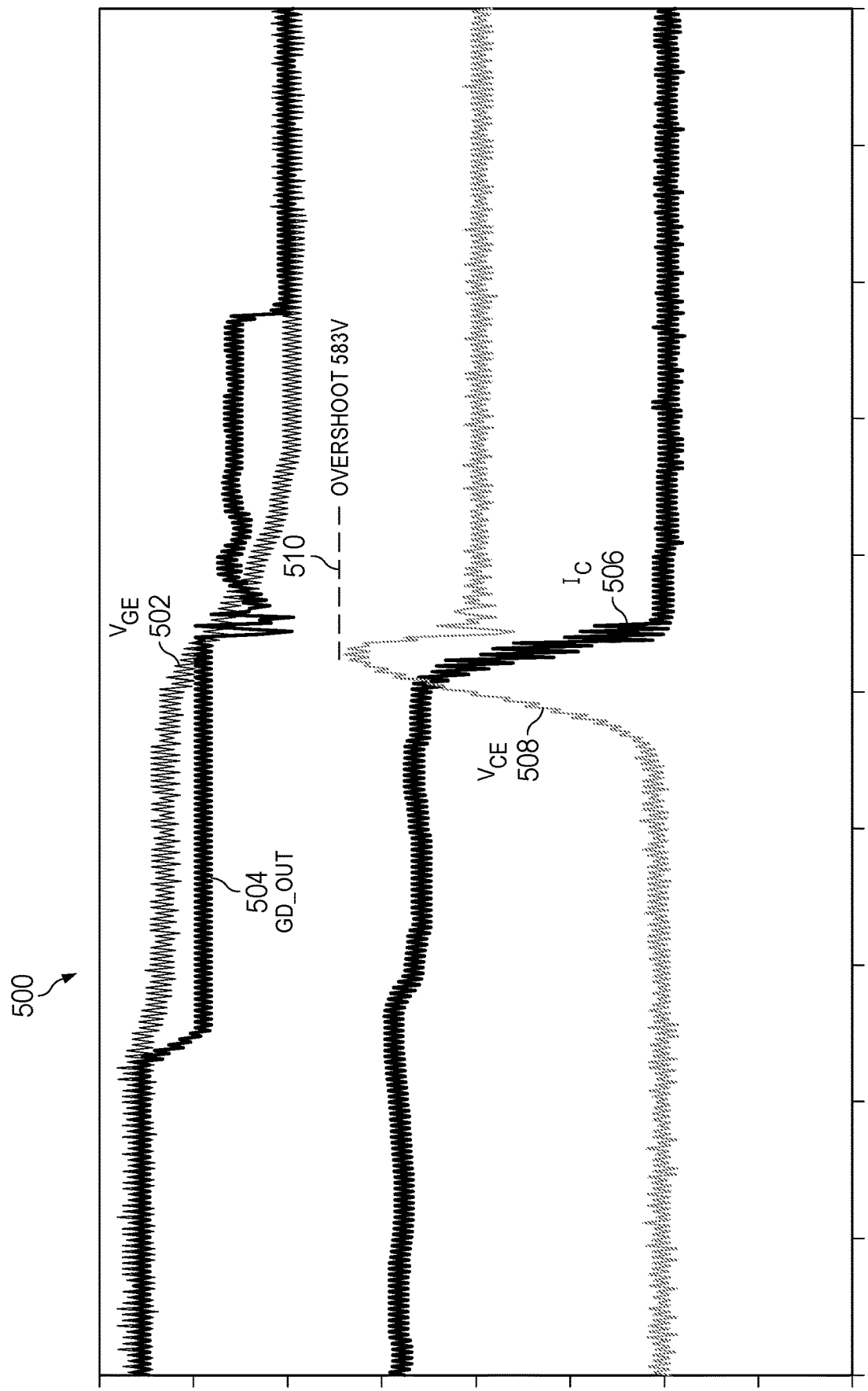
FIG. 5 illustrates an output of a simulation demonstrating reduced transient voltages on a power module output due to parasitic inductances when using a two-level turn-off.

FIG. 5 illustrates an output 500 of a simulation demonstrating reduced transient voltages on a power module output due to parasitic inductances when using a two-level turn-off. In this example simulation, the output of a gate driver GD_OUT 504 to an IGBT is illustrated along with the voltage across the gate to emitter ($V_{GE}$) 502 of the IGBT, the collector current ($I_C$) 506 of the IGBT, and the output voltage $V_{CE}$ 508.

In this simulation, GD_OUT 504 includes an intermediate voltage for a period of time during a two-level turn-off, and when the voltage across the gate to emitter ($V_{GE}$) 502 drops below the threshold voltage of the IGBT, the collector current ($I_C$) 506 drops, and the output 308 sharply rises, however in contrast to the simulation illustrated in FIG. 3 the overshoot 510 is reduced to 583V. In many instances, this reduction is sufficient to protect the 600V rated IGBT from damage.

FIG. 6A illustrates an example embodiment of a circuit 600 designed to provide a two-level turn-off to a power module. In this example embodiment, by appropriately configuring a signal generator within a microcontroller unit 610, a gate driver 620 is sufficient to provide two-level turn-off inputs to a power module even if gate driver 620 does not have variable output settings. Since six gate drivers are used in many three-phase power converters, the cost and area savings from the elimination of diode D1 432 and capacitor C1 434 (of the circuit illustrated in FIG. 4), and the replacement of a complex (expensive) gate driver with a less complex (less expensive) gate driver, is multiplied six-fold.

In this example, microcontroller unit 610 is configured such that a gate driver input signal is generated from a signal generator within microcontroller unit 610 and provided to gate driver 620 causing the gate driver 620 to apply a two-level turn-off input to the gate of an IGBT in a power module and thus reduce the voltage overshoot during turn-off as illustrated in FIG. 5.

In this example, microcontroller unit 610 controls gate driver 620 to provide a two-level turn-off to an IGBT. Microcontroller unit 605 provides input signal GD_IN 615 to gate driver 620. The intermediate voltage of the two-level turn-off is set by appropriately configuring the signal generator. Gate driver 620 provides output GD_OUT 622 to the gate of the IGBT.

In this embodiment, a resistor R1 424 is connected between the output of gate driver 620, GD_OUT 622, and the gate input ($V_{GE}$) 628 of the power switch. R1 624 is configured, in combination with capacitance C1 626 of the power switch, to add a resistor-capacitor (RC) time constant to GD_OUT 622 provided to the gate input of the power switch, $V_{GE}$ 628.

Figure 7:
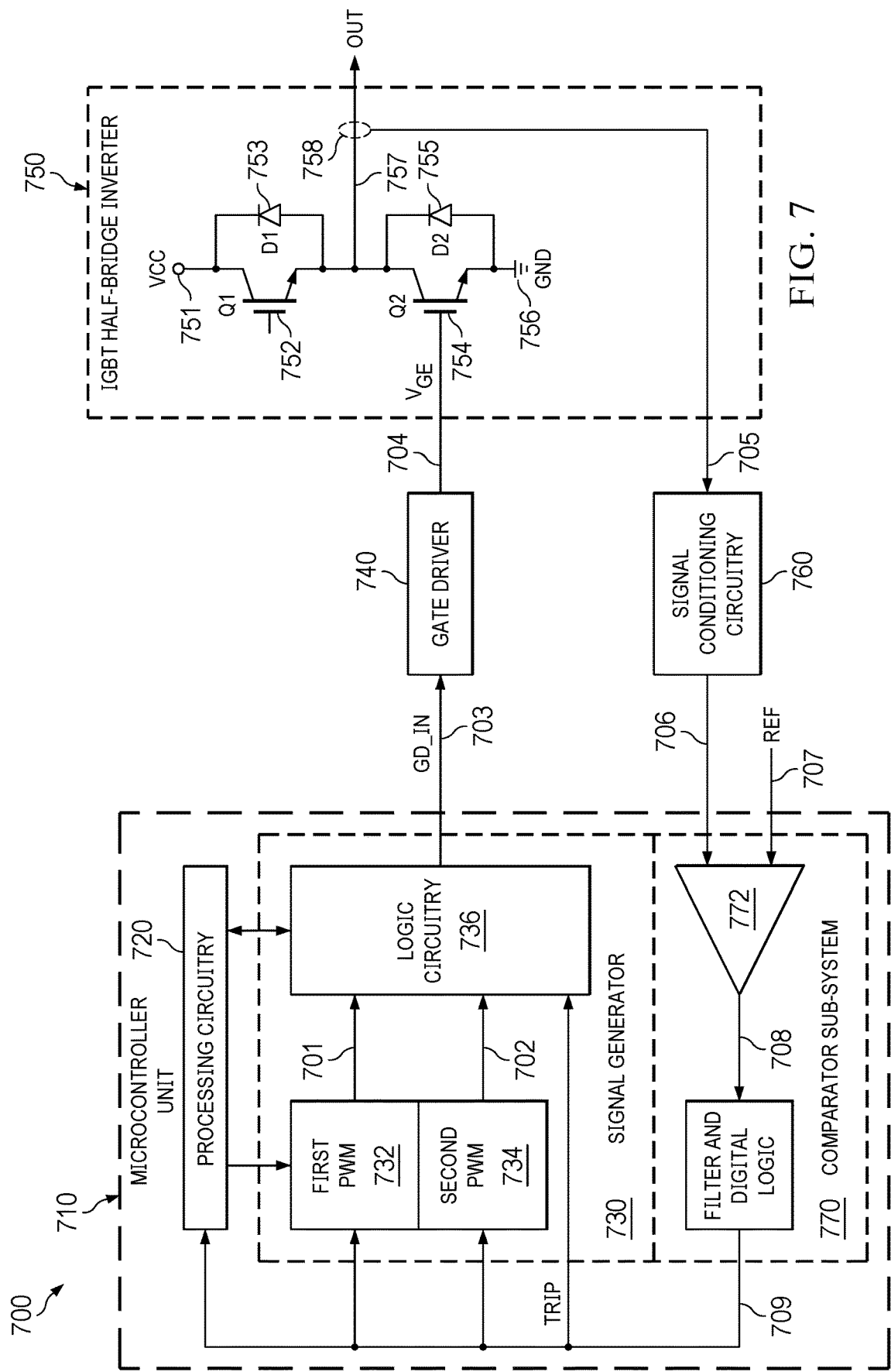
FIG. 7 illustrates an example embodiment of a circuit designed to provide a two-level turn-off to a power module.
Figure 8:
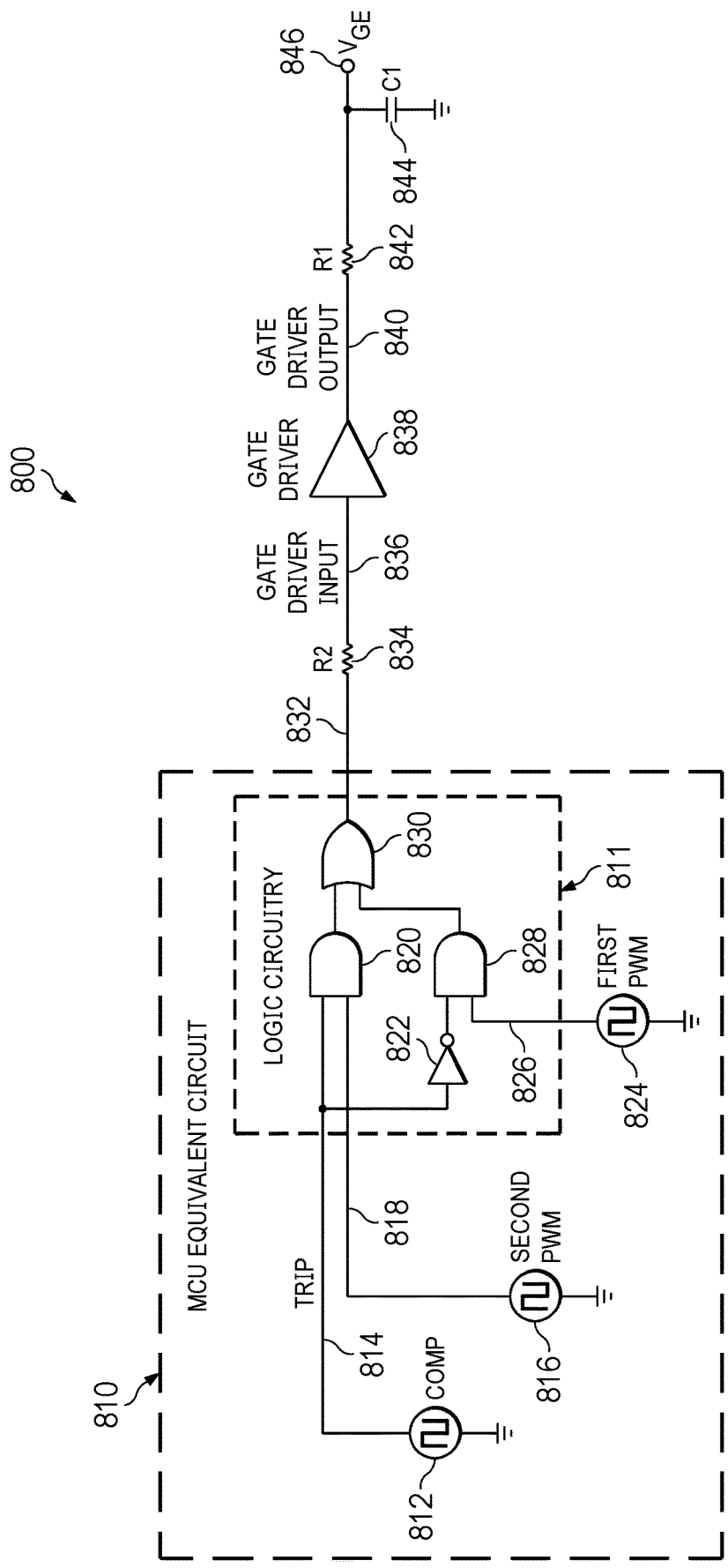
FIG. 8 illustrates an example embodiment of a circuit designed to provide a two-level turn-off to a power module.

Further details of this circuit are illustrated in FIG. 7 and FIG. 8 and described in detail below.

Figure 6B:
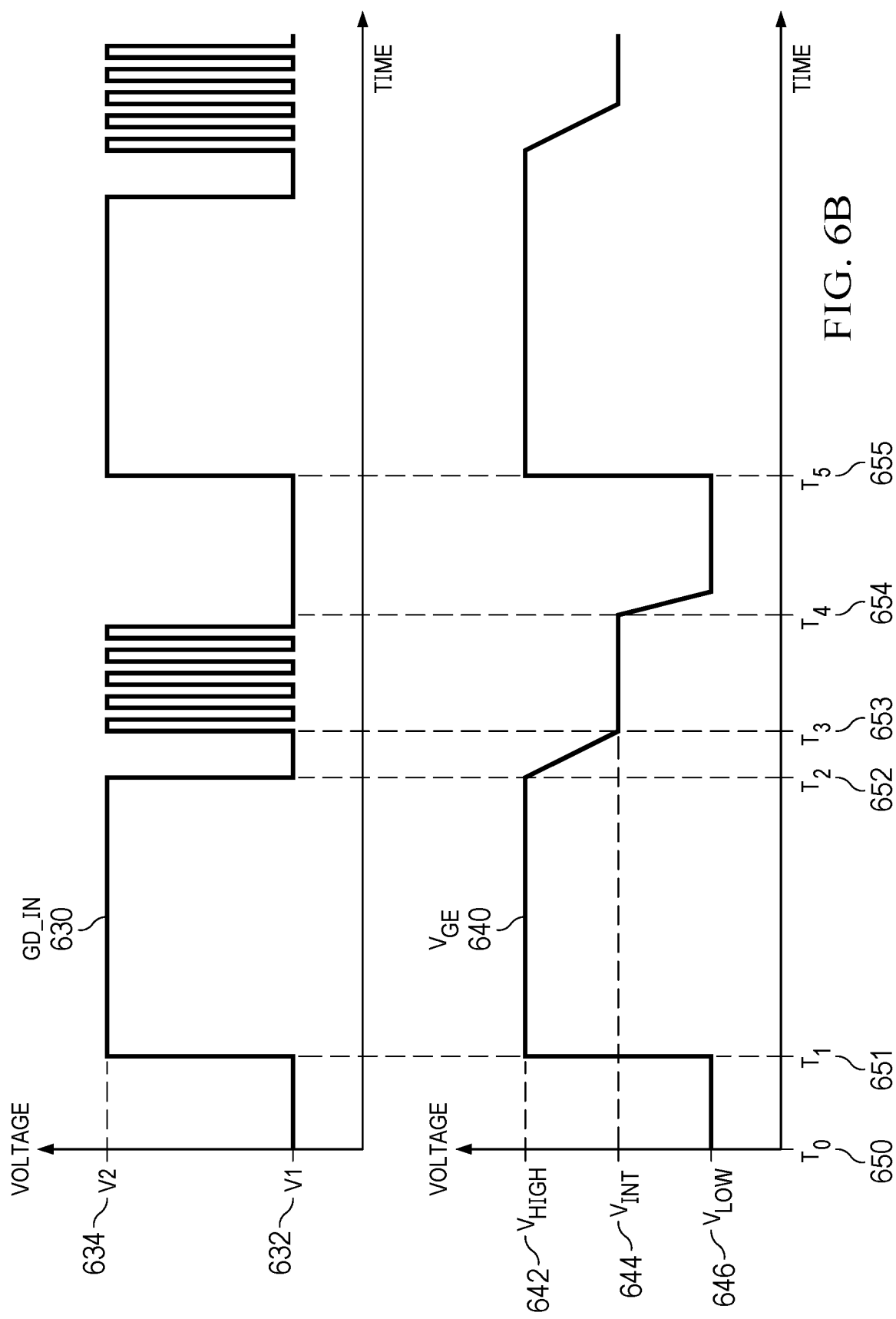
FIG. 6B illustrates example waveforms of signals within the circuit of FIG. 6A.

FIG. 6B illustrates example waveforms 630 and 640 of signals GD_IN 615 and $V_{GE}$ 628 within the circuit of FIG. 6A. In this example embodiment, a signal generator within microcontroller unit 610 is configured to generate a gate driver input signal, GD_IN 615. The gate driver input signal 615, illustrated by waveform 630, has a first voltage V1 632 during a first period of time (between time $T_0$ 650 and $T_1$ 651), a second voltage V2 634 during a second period of time (between time $T_1$ 651 and $T_2$ 652), and toggles between the first voltage V1 632 and the second voltage V2 634 during a configurable third period of time (between time $T_2$ 652 and $T_4$ 654).

In this embodiment, there is a configurable initial delay between time $T_2$ 652 and $T_3$ 653 before GD_IN 615 begins to toggle between V1 632 and V2 634. In various embodiments, the third period of time between time $T_2$ 652 and $T_4$ 654, the frequency of the pulses between time $T_3$ 653 and $T_4$ 654, the duty cycle of the pulses between time $T_3$ 653 and $T_4$ 654, and the number of pulses between time $T_3$ 653 and $T_4$ 654 are configurable in various combinations.

The voltage across the gate to emitter ($V_{GE}$) 628 of the IGBT is illustrated by waveform 640. During the first period of time (between times $T_0$ 650 and $T_1$ 651) $V_{GE}$ 628 is at normal low gate driver output voltage $V_{LOW}$ 646 and the IGBT is off. During the second period of time (between times $T_1$ 651 and $T_2$ 652) $V_{GE}$ 628 is at normal high gate driver output voltage $V_{HIGH}$ 642 and the IGBT is conducting.

During the initial time delay in the third period of time (between times $T_2$ 652 and $T_3$ 653) while GD_IN 615 is at V1 632 and GD_OUT 622 is low, $V_{GE}$ 628 falls from normal high gate driver output voltage $V_{HIGH}$ 642 to intermediate voltage $V_{INT}$ 644 in a slope dependent on the RC time constant of resistor R1 624 and capacitance C1 626. At time $T_3$ 653, GD_IN 615 begins to toggle, and $V_{GE}$ 628 remains at $V_{INT}$ 644 until the end of the third period of time at $T_4$ 654. At the end of the third period of time GD_IN 615 drops to V1 632 and $V_{GE}$ 628 drops to $V_{LOW}$ 646 in a slope dependent on the RC time constant of resistor R1 624 and capacitance C1 626.

The gate driver output signal, GD_OUT 622, is not illustrated here, however it is similar to $V_{GE}$ 628 without the RC delay effect. During the second period of time (between times $T_1$ 651 and $T_2$ 652) GD_OUT 622 is at a third voltage (the normal high gate driver output voltage). During the third period of time, while the gate driver input GD_IN 615 is toggling, the gate driver output GD_OUT 622 drops to an intermediate voltage that is less than the third voltage.

In some embodiments, the intermediate voltage is provided to the IGBT only when the power switch is being shut down, such as during a fault condition. FIG. 7 illustrates a system configured to detect a fault condition in the power switch and provide the intermediate voltage to the IGBT as the power switch is shut down due to the fault. In other embodiments, a similar intermediate voltage at $V_{GE}$ is provided during normal operation of the inverter FIG. 7 illustrates an example embodiment of a circuit 700 designed to provide a two-level turn-off to a power module 750. FIG. 7 is a more detailed illustration of the circuit of FIG. 6. In some embodiments, microcontroller unit 710 is equivalent to microcontroller unit 610 of FIG. 6 and gate driver 740 is equivalent to gate driver 620 of FIG. 6. In this example, microcontroller unit 710 is configured to provide a gate driver input signal GD_IN 703 to gate driver 740 such that gate driver 740 provides a gate driver output signal $V_{GE}$ 704 to the input gate of IGBT Q2 754 within half-bridge inverter 750 providing an intermediate voltage level to $V_{GE}$ 704 during turn-off. In this illustration, the RC circuit of resistor R1 624 and capacitance C1 626 from FIG. 6A is not shown. In this embodiment, microcontroller unit 710 includes processing circuitry 720, signal generator 730, and comparator sub-system 770. Processing circuitry 720 is configured to control signal generator 730 and is coupled with various circuits within signal generator 730.

In this example, microcontroller unit 710 and gate driver 740 are used to drive one IGBT (Q2 754) within IGBT half-bridge inverter 750. IGBT half-bridge inverter 750 includes IGBTs Q1 752 and 754, and diodes D1 753 and D2 755. Power is supplied at $V_{CC}$ 751, and a ground 756 is provided. The output 757 of inverter 750 is monitored for fault conditions by current sensor 758 that provides a current signal 705 to signal conditioning circuitry 760 that in turn provides an output status signal 706 to comparator sub-system 770 within microcontroller unit 710. In some embodiments signal conditioning circuitry 760 is also included within microcontroller unit 710. Comparator sub-system 770 includes comparator 772 and filter and digital logic 774. In this embodiment, comparator 772 receives output status signal 706 from signal conditioning circuitry 760 and compares it to reference signal 707. Comparator 772 generates an output whenever output status signal 706 exceeds reference signal 707. The output of the comparator is filtered and the logic level may be modified by the filter and digital logic 774. Filter and digital logic 774 generate fault signal TRIP 709 upon detection of an over current fault within IGBT half-bridge inverter 750 based on the signal from current sensor 758 or other signals not shown in FIG. 7.

In this example embodiment, signal generator includes first PWM 732, second PWM 734 and logic circuitry 736. In this example, first PWM 732 produces a first signal 701 having a first frequency that is used to drive the input GD_IN 703 to gate driver 740 during normal operation. Second PWM 734 produces a second signal 702 having a second frequency higher than the first frequency that is used to modify the first signal 701 from first PWM 732 using logic circuitry 736 during turn-off in order to produce a two-level turn-off. Second PWM 734 is highly configurable such that the frequency, duty cycle, number of pulses, delay, and the like of its output pulses may be configured in order to best control the two-level turn-off in order to minimize overshoot. In some example embodiments, values for the configurable settings of second PWM 734 are stored in an internal storage system within microcontroller 710.

When an over current fault is detected from output status signal 706, comparator sub-system 770 provides TRIP signal 709 to first PWM 732, second PWM 734, and logic circuitry 736 such that for a period of time during turn-off of inverter 750, second PWM 734 is activated and is used to modify the signal from first PWM 732 in order to produce a gate driver input signal GD_IN 703 that is provided to gate driver 740. After the period of time ends, and the half-bridge inverter 750 is shut down, first PWM 732 and second PWM 734 are shut down.

In some example embodiments, the output of the first PWM 732 remains high while second PWM 734 is active and logic circuitry 736 provides an AND function to the two PWM outputs. In other example embodiments, the output of the first PWM 732 is low while second PWM 734 is active and logic circuitry provides an OR function to the two PWM outputs. In still other example embodiments, the second PWM 734 is active during each cycle of the first PWM 732 regardless of whether or not a fault is detected. A wide variety of embodiments of signal generator 730 may be implemented to provide GD_IN 703 similar to the waveform 630 illustrated in FIG. 6B, all within the scope of the present invention.

The gate of Q1 752 is driven by a second signal generator within microcontroller unit 710 and an additional gate driver similar to gate driver 740. As discussed above, in three-phase power converters microcontroller unit 710 includes six instantiations of signal generator 730 configured to drive six gate drivers similar to gate driver 740. Each of the six gate drivers drive the gate of one IGBT within the three-phase power converter. Each of the six signal generators and gate drivers are configured to operate as described above.

FIG. 8 illustrates an example embodiment of a circuit 800 designed to provide a two-level turn-off to a power module. FIG. 8 is a more detailed illustration of the circuit of FIGS. 6 and 7. In some embodiments, microcontroller equivalent circuit 810 is equivalent to microcontroller unit 710 of FIG. 7 and microcontroller unit 610 of FIG. 6, and gate driver 838 is equivalent to gate driver 740 of FIG. 7 and gate driver 620 of FIG. 6. In this example, the logical path of signals from first PWM 824 and second PWM 816 through gate driver 838 to the gate input of a power switch $V_{GE}$ 846 is illustrated. In this example, an equivalent circuit 810 for a portion of a microcontroller unit is illustrated to show how the first signal from first PWM 824 is modified by the second signal from second PWM 816. Example logic circuitry 811 is illustrated to show the combination of these signals. However, this is one example of how these signals may be combined, and other embodiments use other circuits and methods to combine or generate a combined signal all within the scope of the present invention.

In this example embodiment comparator subsystem COMP 812 generates TRIP 814, first PWM 824 generates a first signal 826 having a first frequency, and second PWM 816 generates a second signal 818 having a second frequency higher than the first frequency. TRIP 814 and the second signal 818 are inputs to AND gate 820, while TRIP 814 is inverted by inverter 822 and, along with the first signal 826, is an input to AND gate 828. The outputs of AND gates 820 and 828 are inputs to OR gate 830 which produces output 832 from the MCU equivalent circuit 810.

Figure 17:
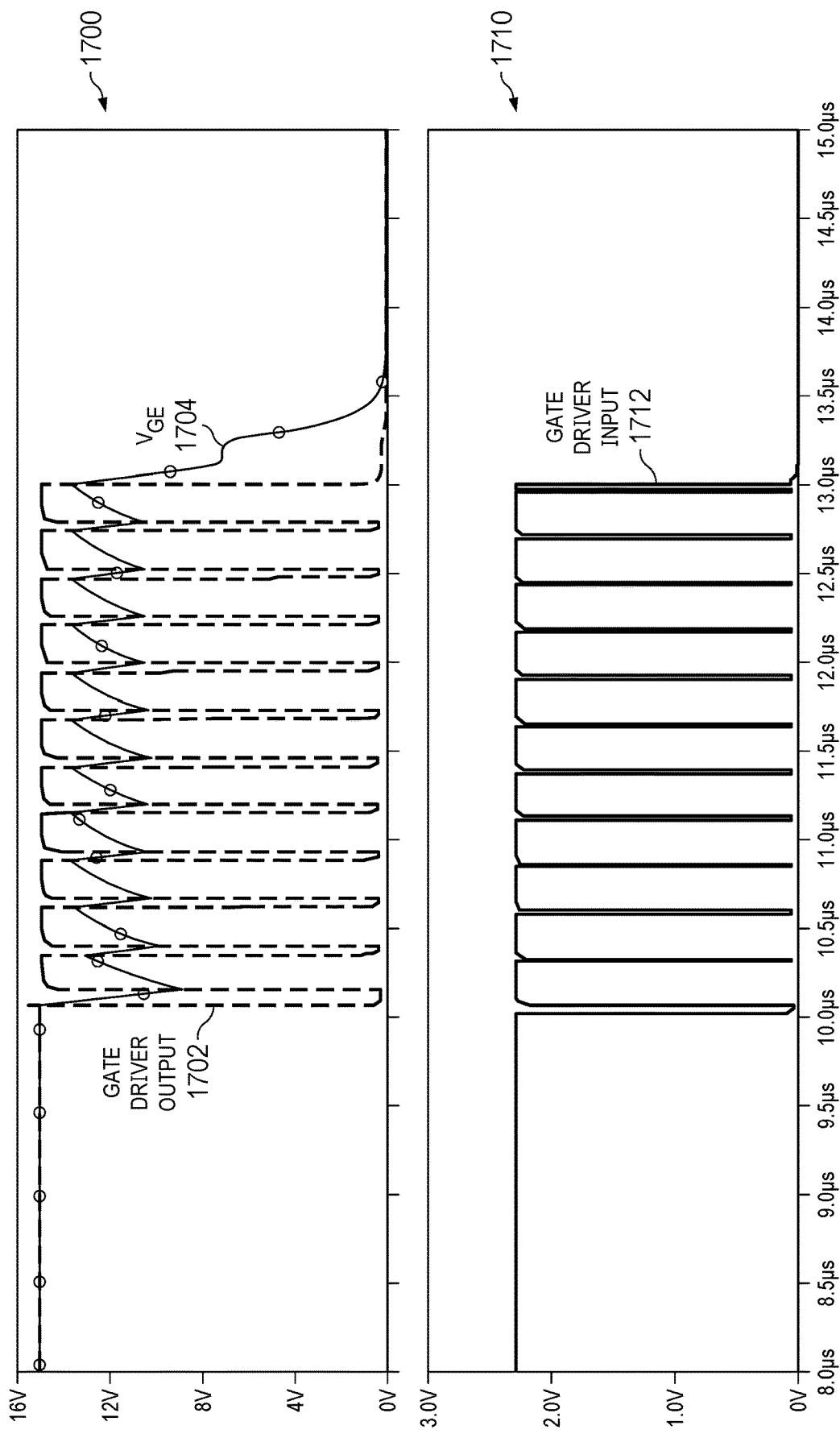
FIG. 17 and FIG. 18 illustrate outputs of simulations of the circuit of FIG. 8 demonstrating the impact of a change in the resistor-capacitor (RC) components at the output of the second pulse width modulator.
Figure 18:
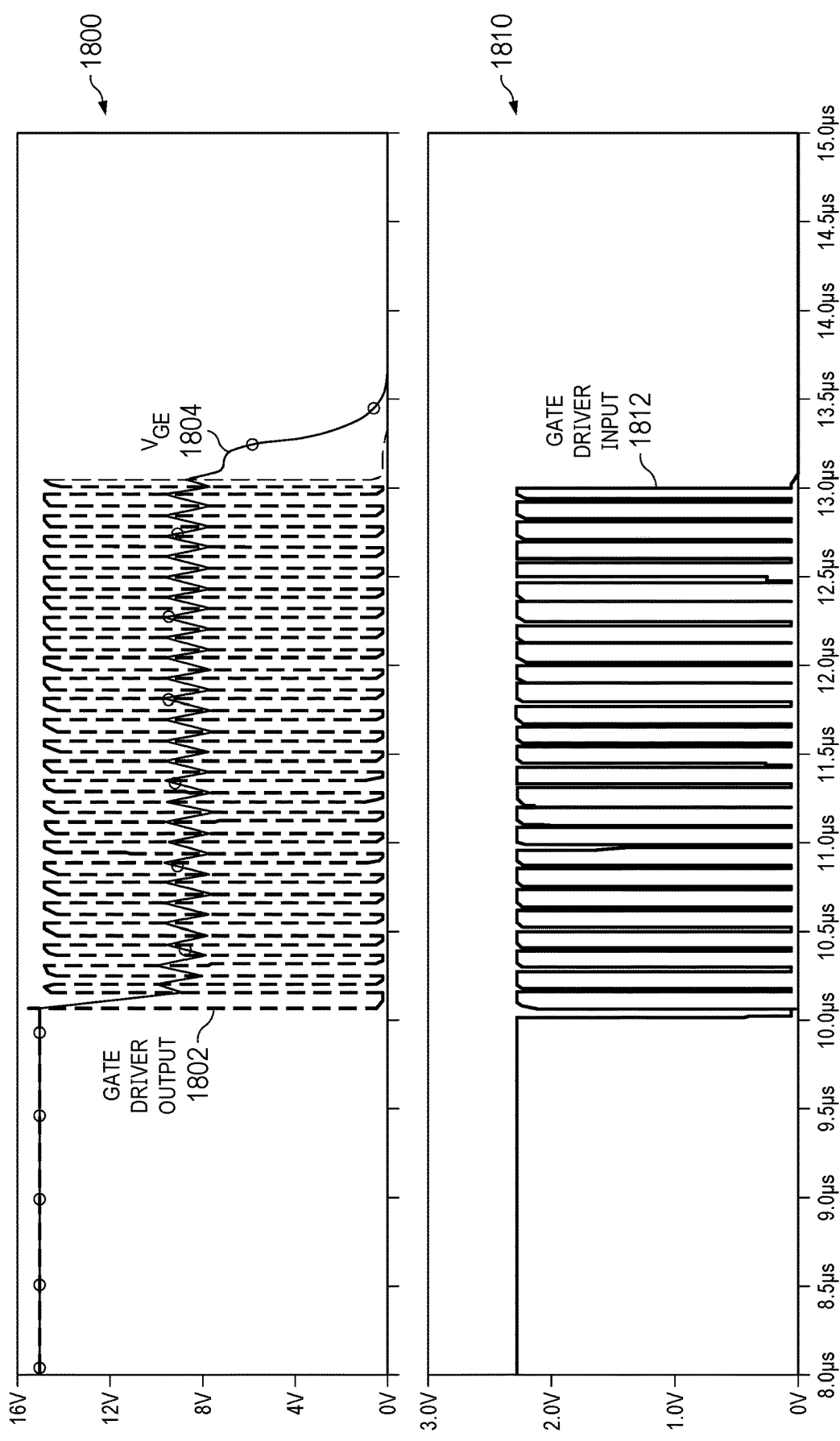

The output 832 from MCU equivalent circuit 810 is provided to gate driver 838 as gate driver input 836 after passing through resistor R2 834. Gate driver 838 produces gate driver output 840. In some embodiments, a resistor R1 842 is connected between the output of gate driver 838 and the gate input 846 of the power switch, configured, in combination with a capacitance C1 844 of the power switch, to add a resistor-capacitor (RC) time constant to the output of the gate driver 838 provided to the gate input of the power switch, $V_{GE}$. The effect of this additional RC time constant is illustrated in FIG. 17 and FIG. 18 and discussed below.

FIGS. 9-18 illustrate outputs of various simulations of the control circuit illustrated in FIG. 7 and FIG. 8. Each of these simulation outputs include waveforms for the gate driver input at node 836 of FIG. 8, the gate driver output at node 840 of FIG. 8 and the gate input of the power switch, $V_{GE}$ at node 846 of FIG. 8. The following simulation outputs illustrate various effects of different configuration of second PWM 816 including different frequencies, duty cycles, number of pulses, and initial delay.

Figure 9:
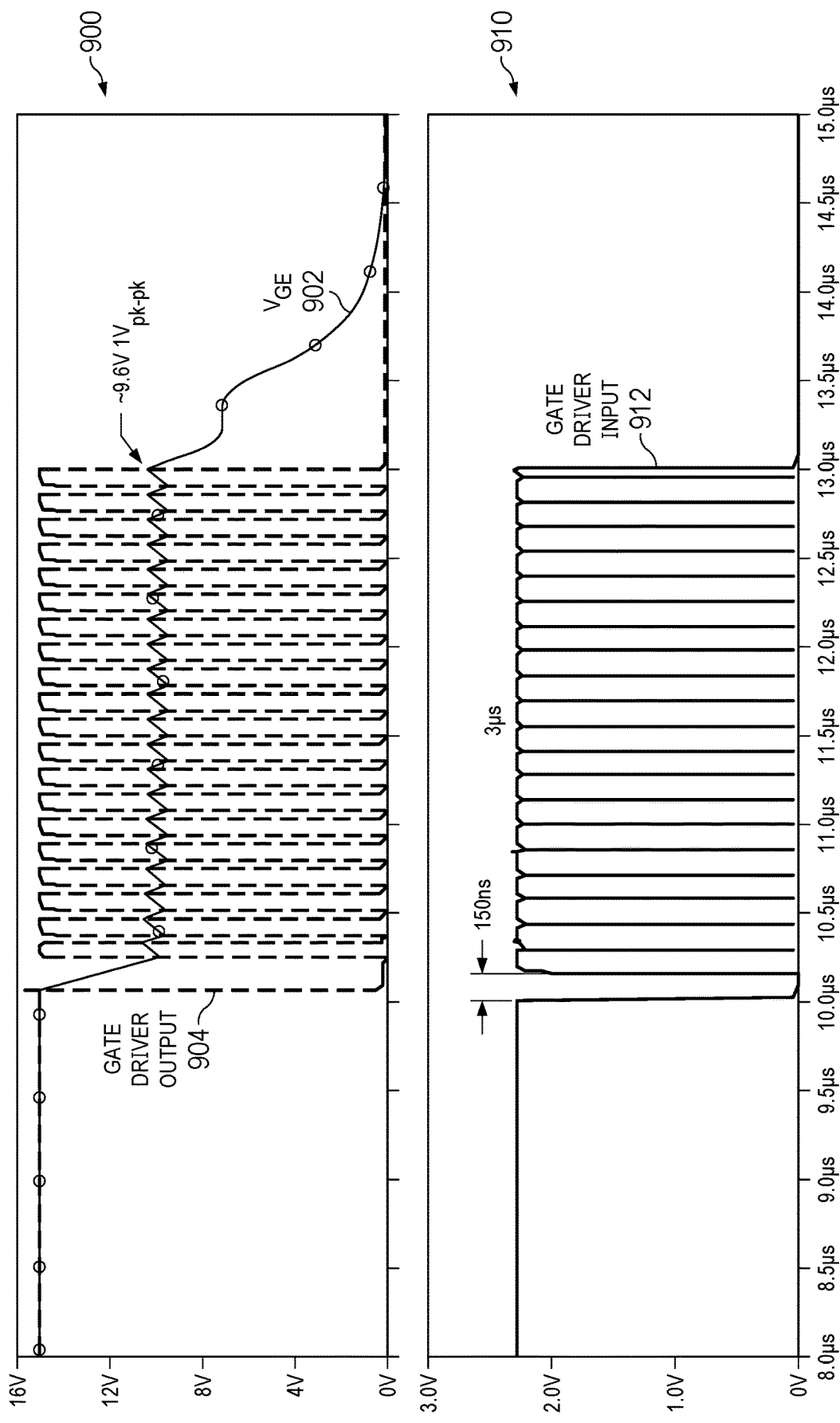
FIG. 9 illustrates outputs of a simulation of the circuit of FIG. 8 demonstrating a two-level turn-off using a microcontroller unit and a less complex gate driver.

FIG. 9 illustrates outputs 900 and 910 of a simulation of the circuit of FIG. 8 demonstrating a two-level turn-off using a microcontroller unit and a less complex gate driver. In this example, simulation gate driver input 912 has a pulse width of 125 ns, a period of 140 ns and an initial delay of 150 ns. Here, second PWM 816 is operational for a total of 3 μs during turn-off. Gate driver output 904 has a pulse width of 90 ns, and $V_{GE}$ 902 has an intermediate voltage of about 9.6V.

Figure 10:
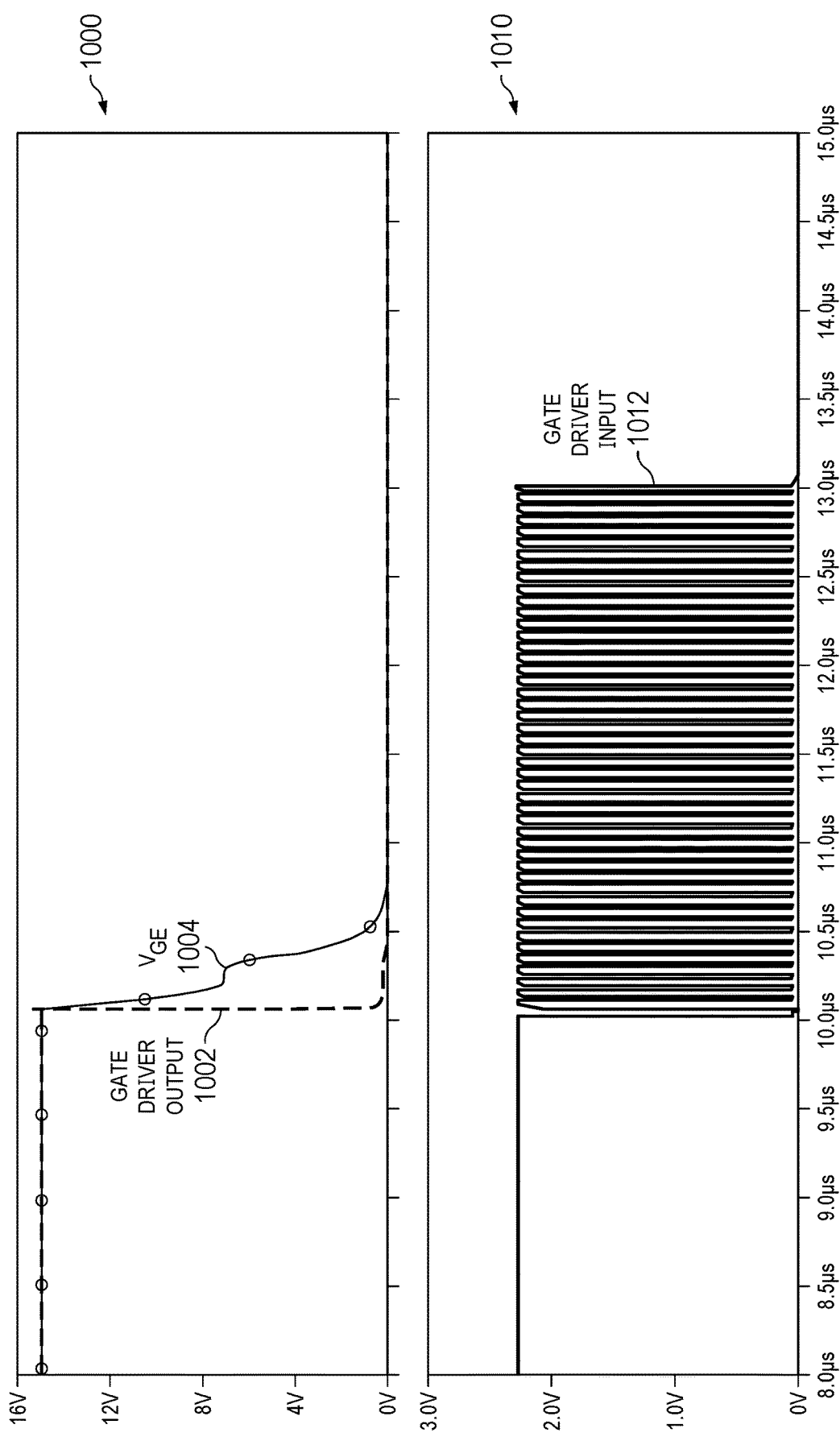
FIG. 10 illustrates outputs of a simulation of the circuit of FIG. 8 demonstrating a maximum second pulse width modulator frequency.

FIG. 10 illustrates outputs 1000 and 1010 of a simulation of the circuit of FIG. 8 demonstrating a maximum second pulse width modulator frequency. In this example simulation gate driver input 1012 has a pulse width of 50 ns, a period of 65 ns and an initial delay of 50 ns. In this example, the frequency of second PWM 816 is too high for gate driver 838, and it stops functioning as seen by gate driver output 1002 and $V_{GE}$ 1004.

Figure 11:
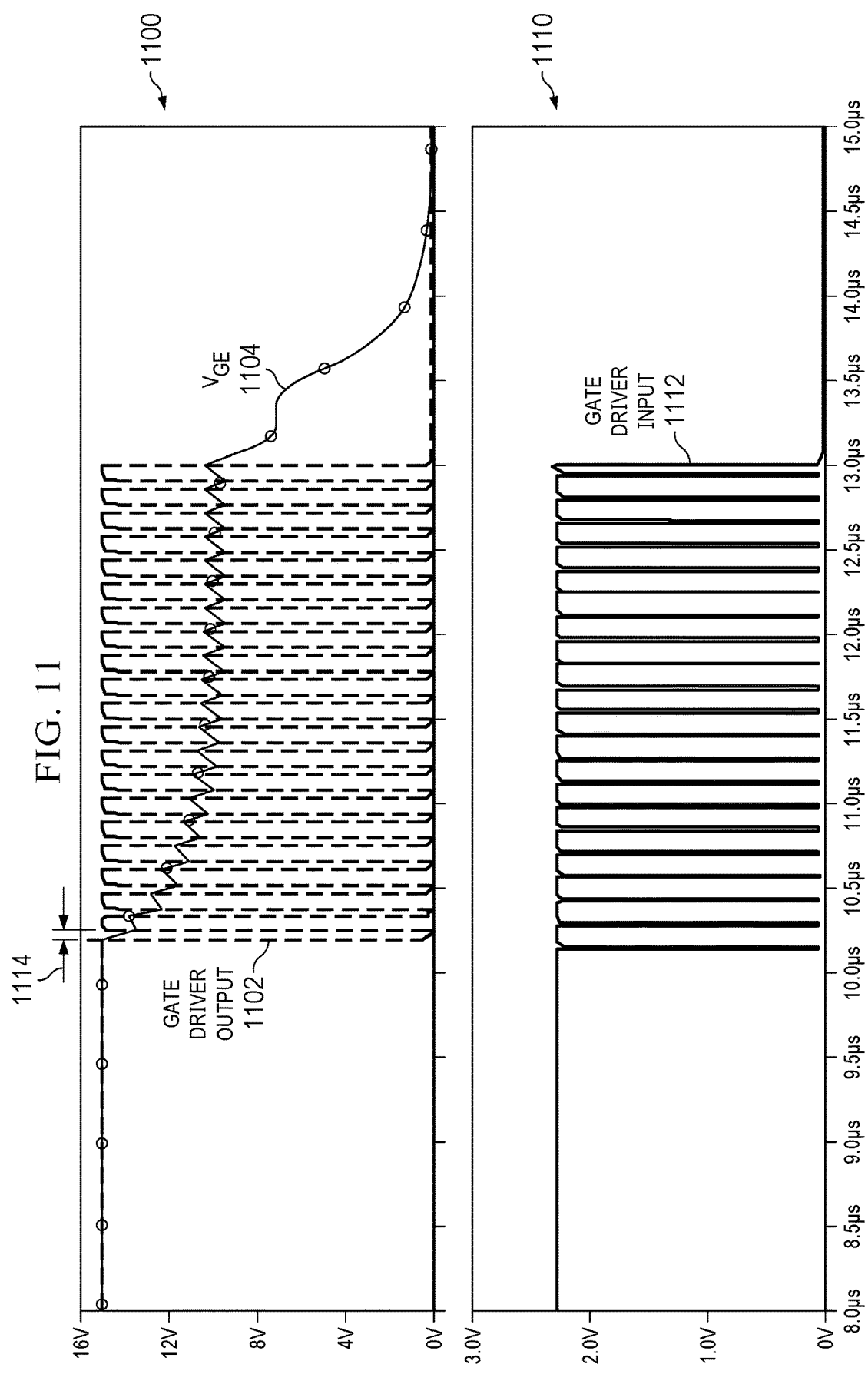
FIG. 11 and FIG. 12 illustrate outputs of simulations of the circuit of FIG. 8 demonstrating the impact of an initial time delay in turning on the second pulse width modulator.
Figure 12:
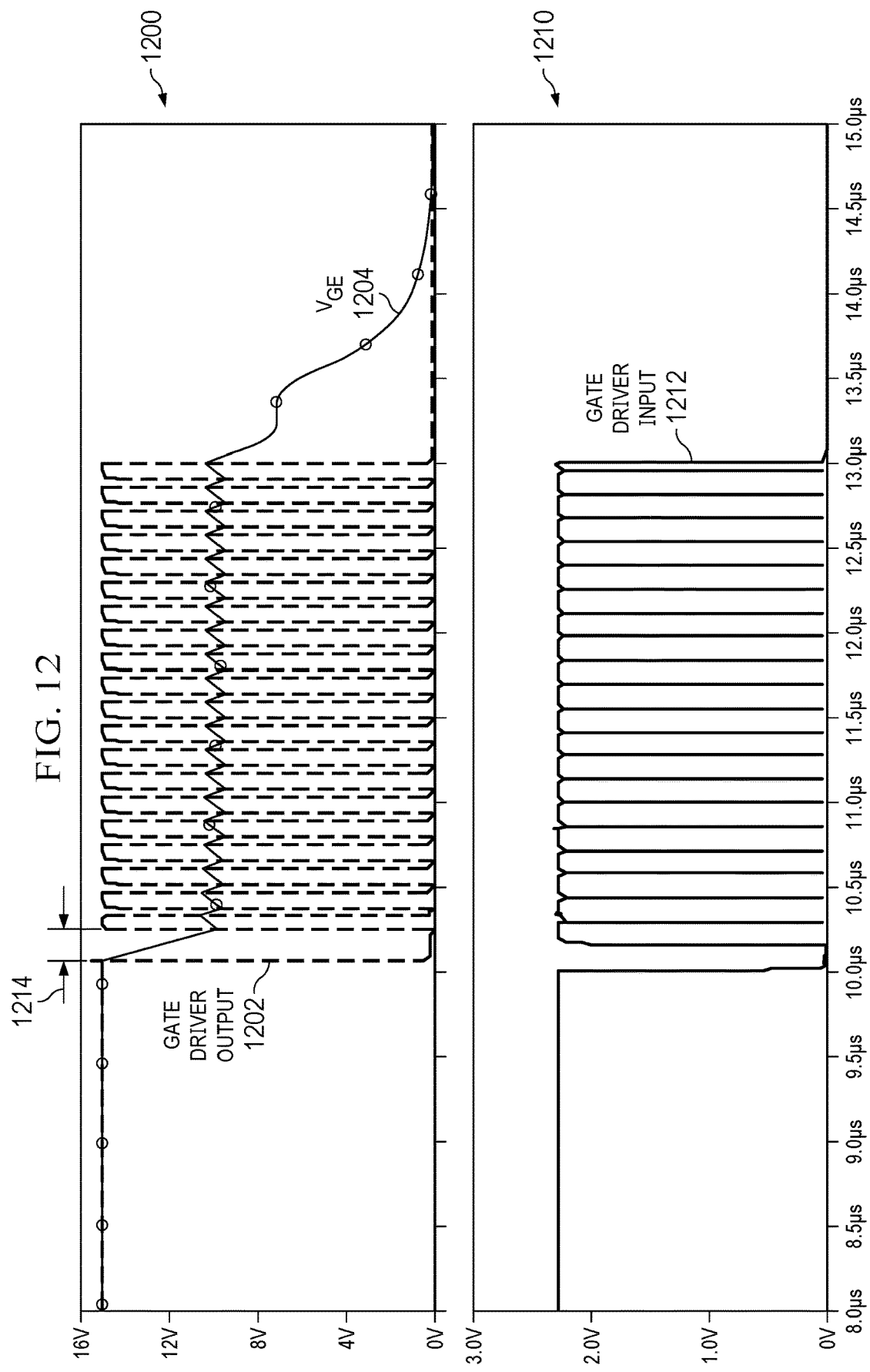

FIG. 11 and FIG. 12 illustrate outputs 1100, 1110, 1200, and 1210 of simulations of the circuit of FIG. 8 demonstrating the impact of an initial time delay in turning on the second pulse width modulator. In the simulation of FIG. 11, gate driver input 1112 has a pulse width of 125 ns, a period of 140 ns, and an initial time delay of 0 ns. Gate driver output 1102 has a very small initial time delay 1114 which does not give the RC circuit of resistor R1 842 and capacitor C1 844 time to lower the voltage of $V_{GE}$ 846 before the output of gate driver 838 begins cycling. As a result, $V_{GE}$ 1104 slowly drops to the desired intermediate value.

In contrast, in the simulation of FIG. 12, gate driver input 1212 has a pulse width of 125 ns, a period of 140 ns, and an initial time delay of 150 ns. In response, gate driver output 1202 has a longer initial time delay 1214 which allows the RC circuit of resistor R1 842 and capacitor C1 844 time to lower the voltage of $V_{GE}$ 846 before the output of gate driver 838 begins cycling. As a result, $V_{GE}$ 1204 drops to the desired intermediate value during the initial time delay 1214 and remains stable for the rest of the two-level turn-off.

Figure 13:
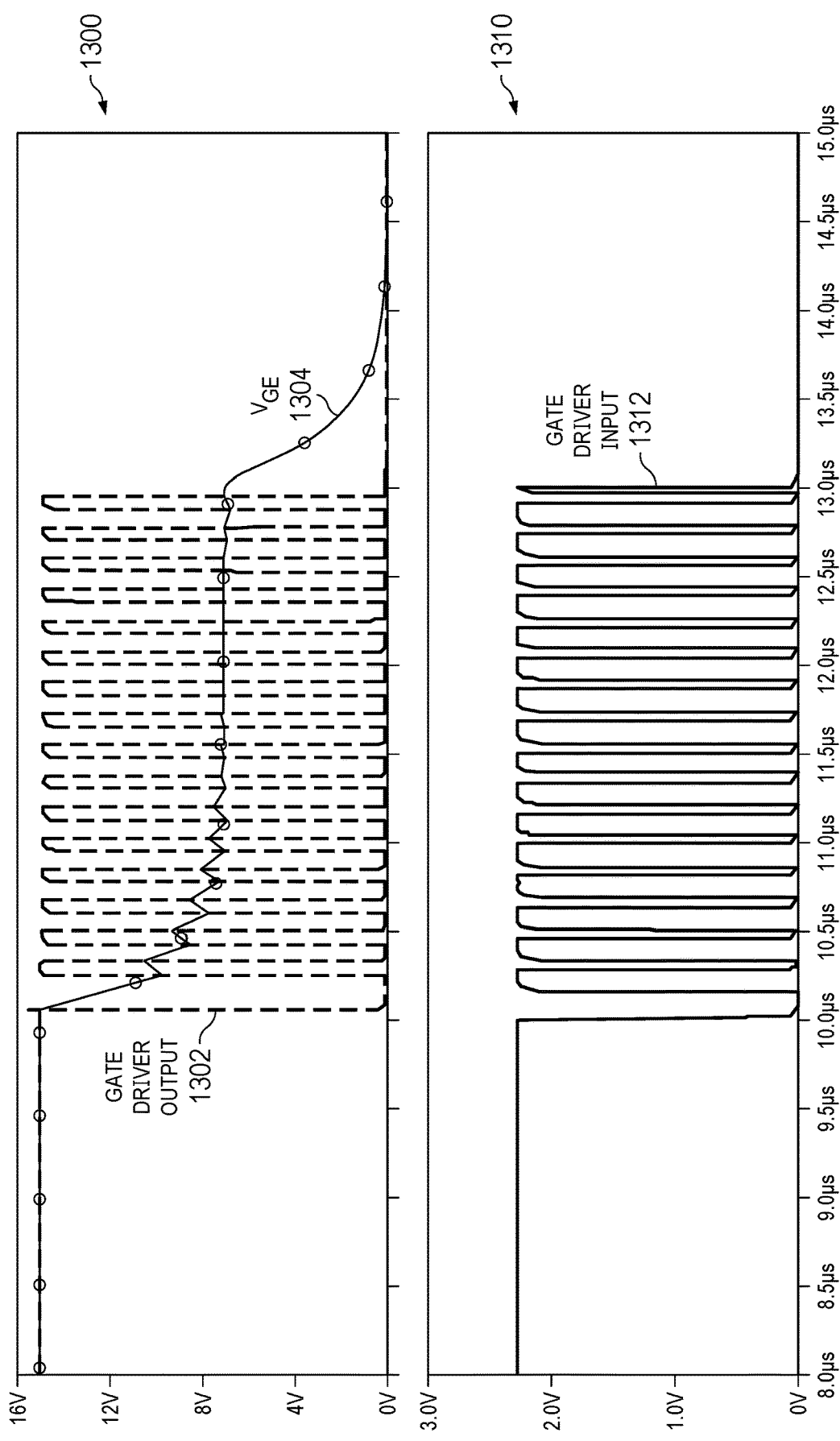
FIG. 13 and FIG. 14 illustrate outputs of simulations of the circuit of FIG. 8 demonstrating the impact of a change in the duty cycle of the second pulse width modulator.
Figure 14:
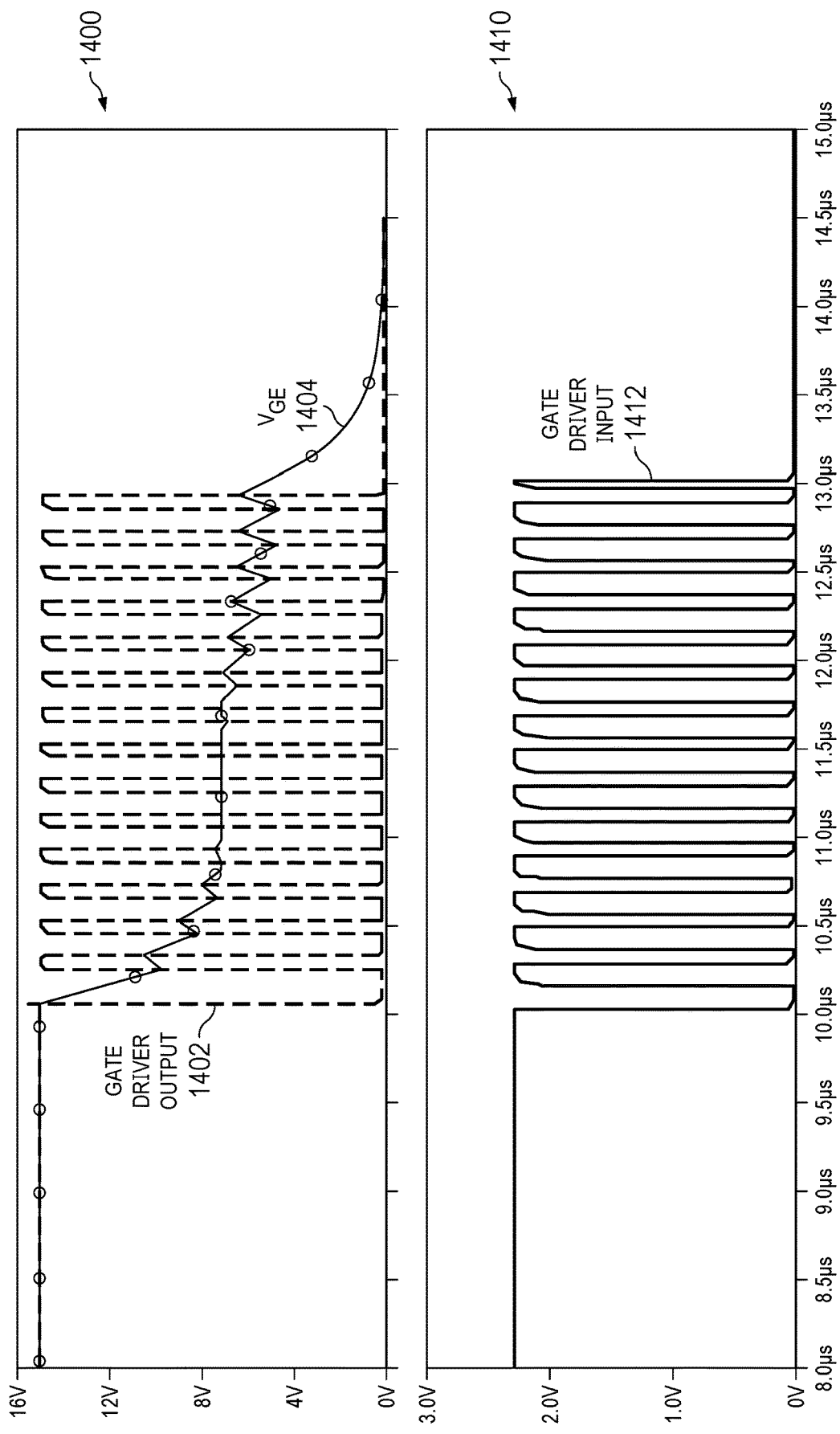

FIG. 13 and FIG. 14 illustrate outputs 1300, 1310, 1400, and 1410 of simulations of the circuit of FIG. 8 demonstrating the impact of a change in the duty cycle of the second pulse width modulator. In the simulation of FIG. 13, gate driver input 1312 has a pulse width of 125 ns, a period of 175 ns, and an initial time delay of 150 ns. Gate driver output 1302 and $V_{GE}$ 1304 show normal operation as a two-level turn-off.

In the simulation of FIG. 14, gate driver input 1412 has a pulse width of 125 ns, a period of 200 ns, and an initial time delay of 150 ns. Gate driver output 1402 and $V_{GE}$ 1404 show normal operation as a two-level turn-off, substantially the same as illustrated in FIG. 13, demonstrating that duty cycle has little effect on $V_{GE}$ 1404.

Figure 15:
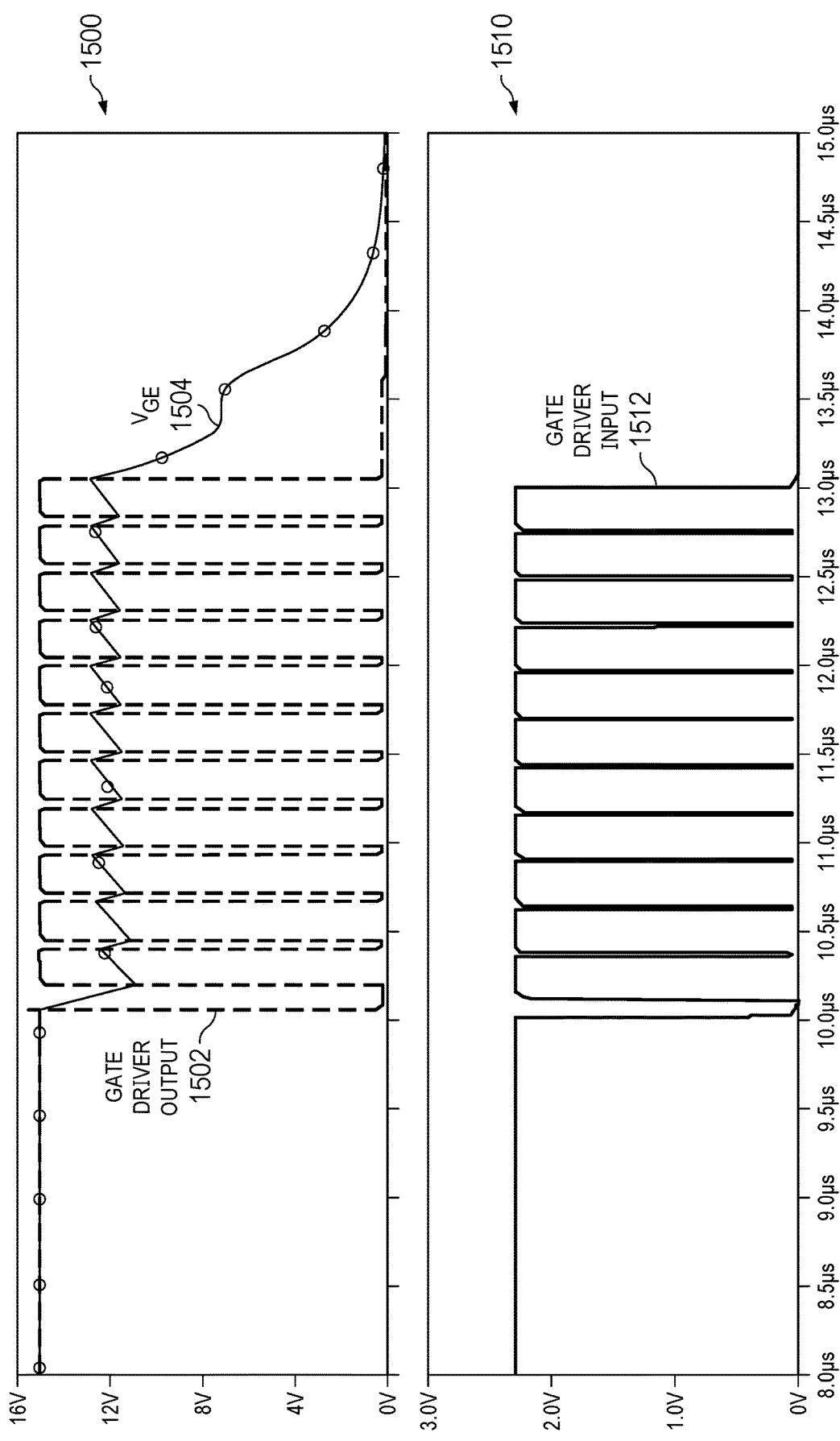
FIG. 15 and FIG. 16 illustrate outputs of simulations of the circuit of FIG. 8 demonstrating the impact of a change in the pulse width of the second pulse width modulator.
Figure 16:
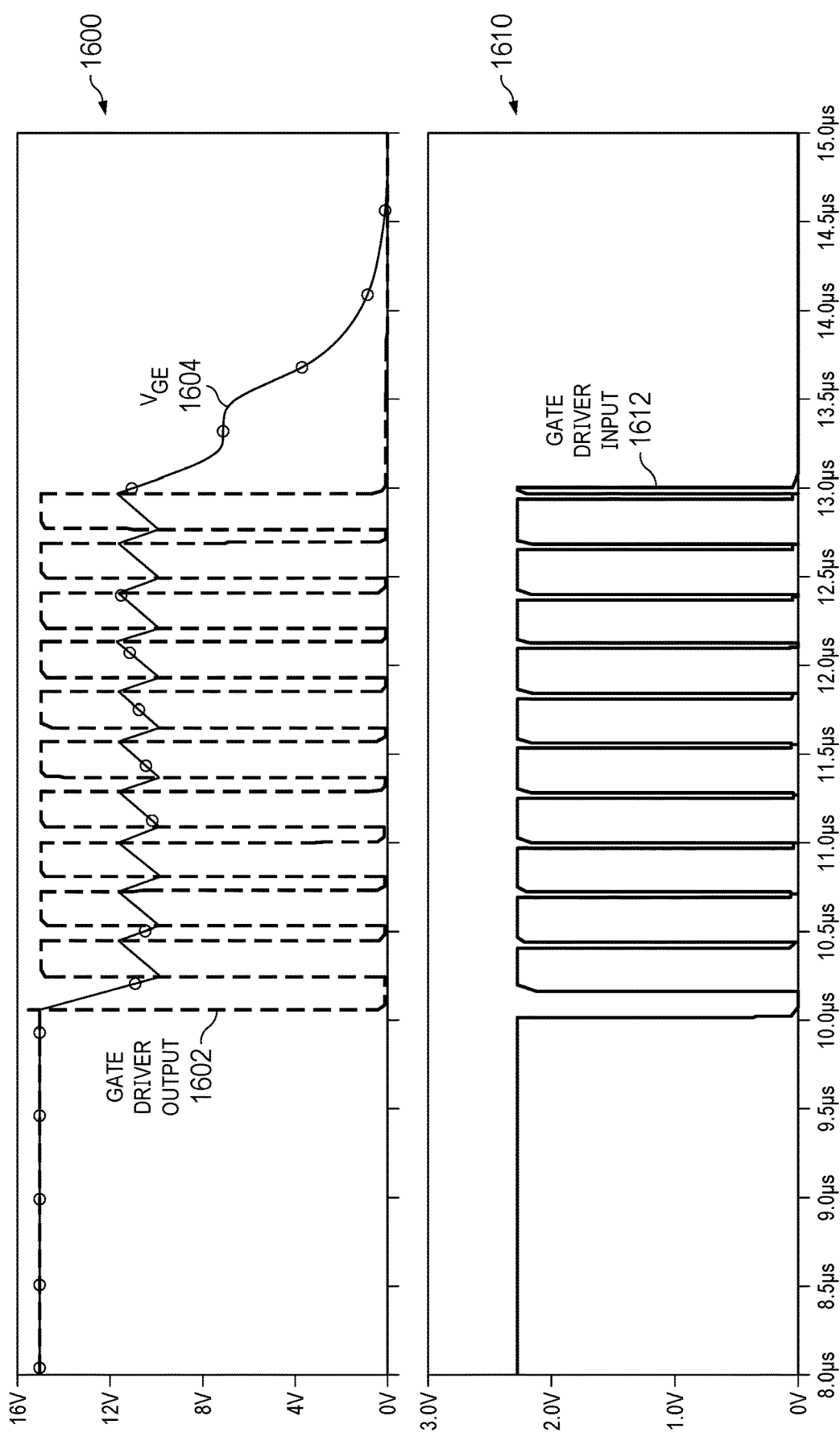

FIG. 15 and FIG. 16 illustrate outputs 1500, 1510, 1600, and 1610 of simulations of the circuit of FIG. 8 demonstrating the impact of a change in the pulse width of the second pulse width modulator. In the simulation of FIG. 15, gate driver input 1512 has a pulse width of 250 ns, a period of 265 ns, and an initial time delay of 100 ns. Gate driver output 1502 reflects the pulse width of gate driver input 1512 and $V_{GE}$ 1504 stabilizes at about 11.5V with 1.4V of ripple.

In the simulation of FIG. 16, gate driver input 1612 has a pulse width of 250 ns, a period of 280 ns, and an initial time delay of 150 ns. Gate driver output 1602 reflects the pulse width of gate driver input 1612 and $V_{GE}$ 1604 stabilizes at about 10.7V with 1.8V of ripple, demonstrating the effect of pulse width on the voltage and ripple of $V_{GE}$ 1604.

FIG. 17 and FIG. 18 illustrate outputs 1700, 1710, 1800, and 1810 of simulations of the circuit of FIG. 8 demonstrating the impact of a change in the RC components at the output of the gate driver. In the simulation of FIG. 17, gate driver input 1712 has a pulse width of 250 ns, a period of 265 ns, and an initial time delay of 50 ns. Resistor R1 842 has a value of 33 ohms and capacitor C1 844 has a value of 4.7 nF. Gate driver output 1702 has a pulse width of 215 ns and $V_{GE}$ 1704 stabilizes at about 12V with 3.4V of ripple.

In the simulation of FIG. 18, gate driver input 1812 has a pulse width of 100 ns, a period of 115 ns, and an initial time delay of 50 ns. Resistor R1 842 has a value of 15 ohms and capacitor C1 844 has a value of 2.2 nF. Gate driver output 1802 has pulse width of 66 ns and $V_{GE}$ 1804 stabilizes at about 8.7V with 2V of ripple, demonstrating the effect of the resistor-capacitor (RC) time constant and second PWM frequency on the voltage and ripple of $V_{GE}$ 1804. Lower RC time constants result in higher ripple, while higher frequencies result in higher distortion.

Figure 19:
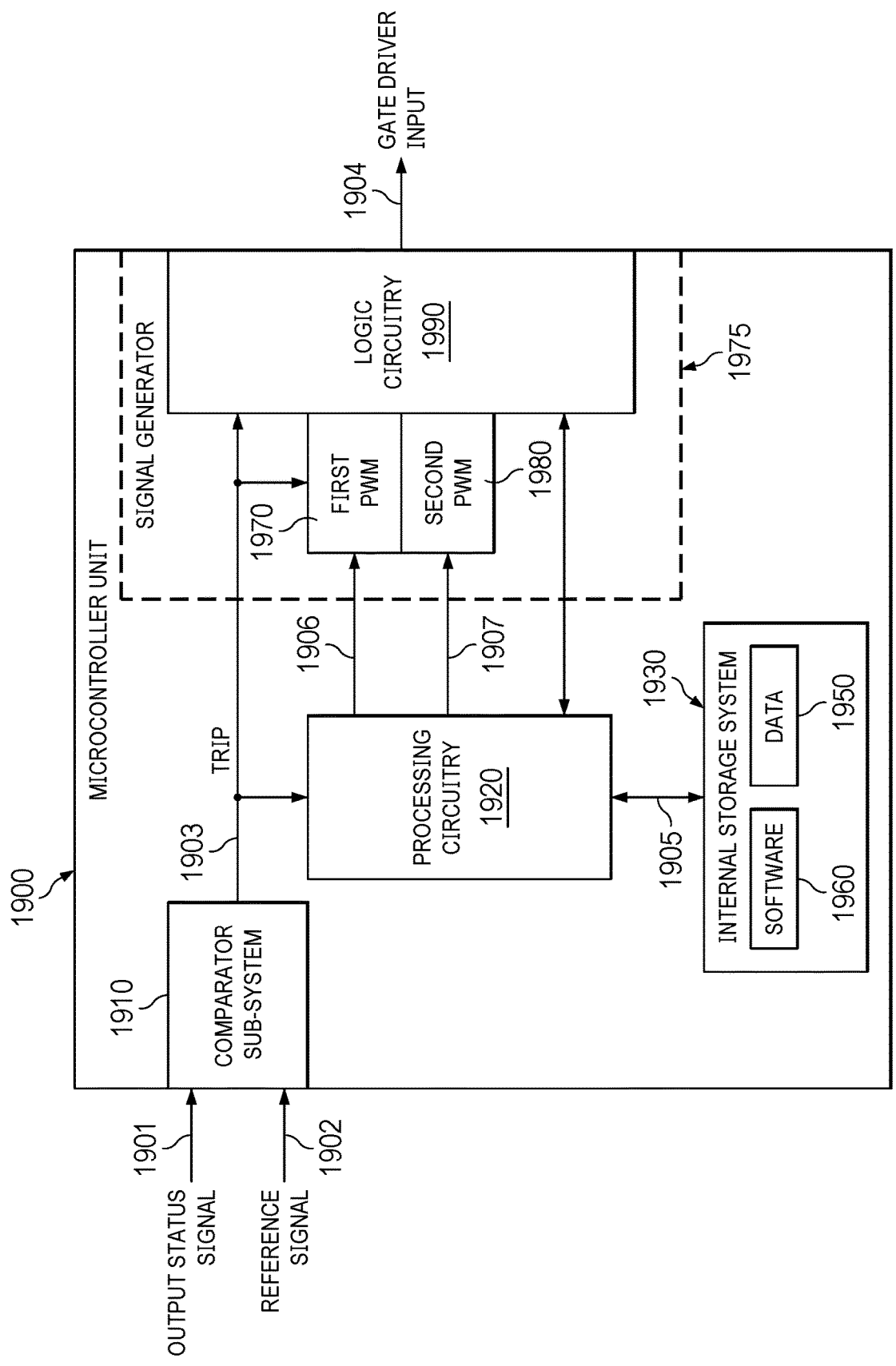
FIG. 19 illustrates a block diagram of an example embodiment of a microcontroller unit configured to provide a two-level turn-off to a power module.

FIG. 19 illustrates a block diagram of an example embodiment of a microcontroller unit 1900 configured to provide a two-level turn-off to a power module. FIG. 19 is a more detailed illustration of the microcontroller unit of FIGS. 6-8. In some embodiments, microcontroller unit 1900 is equivalent to microcontroller equivalent circuit 810, microcontroller unit 710 of FIG. 7, and microcontroller unit 610 of FIG. 6. As discussed above, microcontroller unit 1900 may take on any of a wide variety of configurations. Here, a simplified example configuration is provided for a microcontroller unit 610 as illustrated in FIG. 6 and described above.

In this example embodiment, microcontroller unit 1900 comprises comparator sub-system 1910, processing circuitry 1920, first PWM module 1970, second PWM module 1980, logic circuitry 1990, and internal storage system 1930. In this embodiment, first PWM module 1970, second PWM module 1980, and logic circuitry 1990 together comprise signal generator 1975. Comparator sub-system 1910 comprises circuitry configured to receive an output status signal 1901 from an output conditioner such as signal conditioning circuitry 760 from FIG. 7 described above. First PWM module 1970 is a pulse width modulator configured to provide a first signal having a first frequency, such as first PWM 732 from FIG. 7 described above. Second PWM module 1980 is a PWM configured to provide a second signal having a second frequency higher than the first frequency, such as second PWM 734 from FIG. 7 described above. Comparator sub-system 1910 is also configured to provide a TRIP signal 1903 to first PWM 1970, second PWM 1980, and logic circuitry 1990. Logic circuitry 1990 is configured to process the first signal and the second signal to produce a gate driver input signal 1904 based on the first and second signals, similar to logic circuitry 811 from FIG. 8 described above.

Processing circuitry 1920 comprises electronic circuitry configured to direct microcontroller unit 1900 to provide a two-level turn-off as described above. Processing circuitry 1920 may comprise microprocessors and other circuitry that retrieves and executes software 1960. Examples of processing circuitry 1920 include general purpose central processing units, application specific processors, and logic devices, as well as any other type of processing device, combinations, or variations thereof. Processing circuitry 1920 can be implemented within a single processing device but can also be distributed across multiple processing devices or sub-systems that cooperate in executing program instructions.

Internal storage system 1930 can comprise any non-transitory computer readable storage media capable of storing software 1960 that is executable by processing circuitry 1920. Internal storage system 1930 can also include various data structures 1950 which comprise one or more registers, databases, tables, lists, or other data structures. Storage system 1930 can include volatile and nonvolatile, removable and non-removable media implemented in any method or technology for storage of information, such as computer readable instructions, data structures, program modules, or other data. In this example embodiment, internal storage system 1930 includes flash memory within microcontroller unit 1900 which also stores configuration information for second PWM 1980.

Storage system 1930 can be implemented as a single storage device but can also be implemented across multiple storage devices or sub-systems co-located or distributed relative to each other. Storage system 1930 can comprise additional elements, such as a controller, capable of communicating with processing circuitry 1920. Examples of storage media include random access memory, read only memory, magnetic disks, optical disks, flash memory, virtual memory and non-virtual memory, magnetic cassettes, magnetic tape, magnetic disk storage or other magnetic storage devices, or any other medium which can be used to store the desired information and that can be accessed by an instruction execution system, as well as any combination or variation thereof.

Software 1960 can be implemented in program instructions and among other functions can, when executed by microcontroller unit 1900 in general or processing circuitry 1920 in particular, direct microcontroller unit 1900, or processing circuitry 1920, to operate as described herein to control a power switch. Software 1960 can include additional processes, programs, or components, such as operating system software, database software, or application software. Software 1960 can also comprise firmware or some other form of machine-readable processing instructions executable by elements of processing circuitry 1920.

In at least one example implementation, the program instructions include various modules configured to direct processing circuitry 1920 to control first PWM module 1970, second PWM module 1980, and logic circuitry 1990 to produce two-level turn-off for a power switch as described above.

In general, software 1960 can, when loaded into processing circuitry 1920 and executed, transform processing circuitry 1920 overall from a general-purpose computing system into a special-purpose computing system customized to operate as described herein for a microcontroller unit 1900 configured to control a power switch, among other operations. Encoding software 1960 on internal storage system 1930 can transform the physical structure of internal storage system 1930. The specific transformation of the physical structure can depend on various factors in different implementations of this description. Examples of such factors can include, but are not limited to the technology used to implement the storage media of internal storage system 1930 and whether the computer-storage media are characterized as primary or secondary storage.

For example, if the computer-storage media are implemented as semiconductor-based memory, software 1960 can transform the physical state of the semiconductor memory when the program is encoded therein. For example, software 1960 can transform the state of transistors, capacitors, or other discrete circuit elements constituting the semiconductor memory. A similar transformation can occur with respect to magnetic or optical media. Other transformations of physical media are possible without departing from the scope of the present description, with the foregoing examples provided only to facilitate this discussion.

Figure 20:
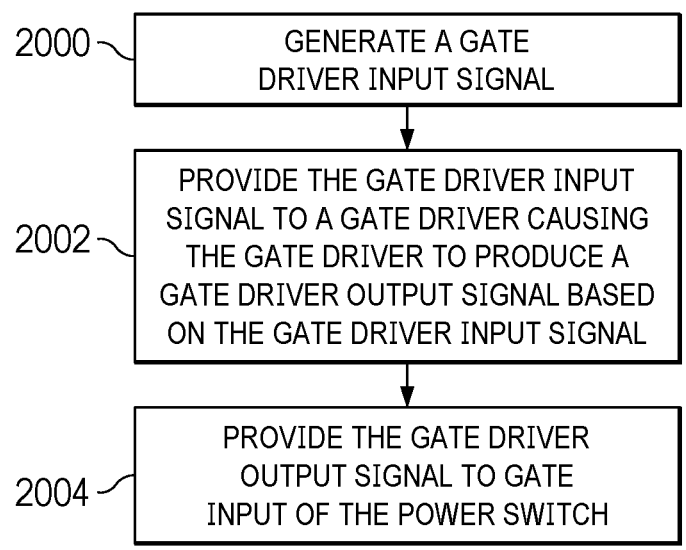
FIG. 20 illustrates a flow chart of an example embodiment of a method for using a microcontroller unit to provide a two-level turn-off to a power module.

FIG. 20 illustrates a flow chart of an example embodiment of a method for using a microcontroller unit 710 to provide a two-level turn-off to a power module.

In this example method, microcontroller unit 710 produces a gate driver input signal GD_IN 703 from a signal generator 730, (operation 2000). The gate driver input signal GD_IN 703 has a first voltage during a first period of time, a second voltage during a second period of time, and toggles between the first voltage and the second voltage during a configurable third period of time.

Microcontroller unit 710 provides the gate driver input signal GD_IN 703 to a gate driver 740 causing the gate driver 740 to produce a gate driver output signal $V_{GE}$ 704 based on the gate driver input signal GD_IN 703, (operation 2002).

Gate driver 740 provides the gate driver output signal $V_{GE}$ 704 to the gate input of the power switch 750, (operation 2004). The gate driver input signal GD_IN 703 toggles during the third period of time such that the gate driver output signal $V_{GE}$ 704 has a third voltage during the second period of time, and an intermediate voltage $V_{INT}$ 644 less than the third voltage during the third period of time.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above may be combined in various ways to form multiple embodiments. As a result, the invention is not limited to the specific embodiments described above, but only by the claims and their equivalents.

What is claimed is:

1. An electronic circuit for controlling a power switch having a gate input, comprising:
    a signal generator configured to generate a gate driver input signal, wherein the gate driver input signal has a first voltage during a first period of time, a second voltage during a second period of time, and toggles between the first voltage and the second voltage during a third period of time; and
    a gate driver configured to receive the gate driver input signal and to provide a gate driver output signal to the gate input of the power switch based on the gate driver input signal; and
    wherein the signal generator is configured to cause the gate driver input signal to toggle during the third period of time such that the gate driver output signal has a third voltage during the second period of time, and an intermediate voltage that is less than the third voltage during the third period of time.

2. The electronic circuit of claim 1, wherein the signal generator is configurable to generate the gate driver input signal having a desired initial delay during the third period of time.

3. The electronic circuit of claim 1, wherein the signal generator is configurable to generate the gate driver input signal having a desired frequency during the third period of time.

4. The electronic circuit of claim 1, wherein the signal generator is configurable to generate the gate driver input signal having a desired number of pulses during the third period of time.

5. The electronic circuit of claim 1, wherein the signal generator is provided within a microcontroller unit.

6. The electronic circuit of claim 1, wherein the signal generator comprises:
    a first pulse width modulator configured to generate a first signal having a first frequency;

a second pulse width modulator configured to generate a second signal having a second frequency higher than the first frequency during the third period of time; and logic circuitry configured to receive the first and second signals and to generate the gate driver input signal based on the first and second signals.

7. The electronic circuit of claim 6, wherein the second pulse width modulator is configured to generate the second signal while the electronic circuit is turning off the power switch in response to a fault.

8. The electronic circuit of claim 1, further comprising:
a resistor connected between an output of the gate driver and the gate input of the power switch, configured, in combination with a capacitance of the power switch, to add a resistor-capacitor (RC) time constant to the output of the gate driver provided to the gate input of the power switch.

9. A microcontroller unit for controlling a power switch having a gate input, comprising:
a signal generator configured to generate a gate driver input signal, wherein the gate driver input signal has a first voltage during a first period of time, a second voltage during a second period of time, and toggles between the first voltage and the second voltage during a third period of time;
wherein the gate driver input signal, when provided to a gate driver causes the gate driver to provide a gate driver output signal to the gate input of the power switch based on the gate driver input signal; and
wherein the signal generator is further configured to cause the gate driver input signal to toggle during the third period of time such that the gate driver output signal has a third voltage during the second period of time, and an intermediate voltage that is less than the third voltage during the third period of time.

10. The microcontroller unit of claim 9, wherein the signal generator is configurable to generate the gate driver input signal having a desired initial delay during the third period of time.

11. The microcontroller unit of claim 9, wherein the signal generator is configurable to generate the gate driver input signal having a desired frequency during the third period of time.

12. The microcontroller unit of claim 9, wherein the signal generator is configurable to generate the gate driver input signal having a desired number of pulses during the third period of time.

13. The microcontroller unit of claim 9, wherein the signal generator comprises:
a first pulse width modulator configured to generate a first signal having a first frequency;
a second pulse width modulator configured to generate a second signal having a second frequency higher than the first frequency during the third period of time; and
logic circuitry configured to receive the first and second signals and to generate the gate driver input signal based on the first and second signals.

14. The microcontroller unit of claim 13, further comprising:
a comparator sub-system configured to:
receive an output status signal based on an output of the power switch;
compare the output status signal to a reference signal; and
generate a fault signal based on a difference between the output status signal and the reference signal.

15. The microcontroller unit of claim 14, wherein the second pulse width modulator is configured to generate the second signal while the microcontroller unit is turning off the power switch in response to the fault signal.

16. The microcontroller unit of claim 9, wherein a resistor connected between an output of the gate driver and the gate input of the power switch, in combination with a capacitance of the power switch, adds a resistor-capacitor (RC) time constant to the output of the gate driver provided to the gate input of the power switch.

17. A method for using a microcontroller unit to control a power switch having a gate input, the method comprising:
generating a gate driver input signal, wherein the gate driver input signal has a first voltage during a first period of time, a second voltage during a second period of time, and toggles between the first voltage and the second voltage during a third period of time;
providing the gate driver input signal to a gate driver causing the gate driver to produce a gate driver output signal based on the gate driver input signal; and
providing the gate driver output signal to the gate input of the power switch;
wherein the gate driver input signal toggles during the third period of time such that the gate driver output signal has a third voltage during the second period of time, and an intermediate voltage that is less than the third voltage during the third period of time.

18. The method of claim 17, wherein generating a gate driver input signal comprises:
generating a first signal having a first frequency from a first pulse width modulator;
generating a second signal having a second frequency higher than the first frequency during the third period of time from a second pulse width modulator; and
generating the gate driver input signal based on the first and second signals from logic circuitry.

19. The method of claim 18, further comprising:
receiving an output status signal based on an output of the power switch;
comparing the output status signal to a reference signal; and
generating a fault signal based on a difference between the output status signal and the reference signal.

20. The method of claim 19, wherein the second pulse width modulator is configured to generate the second signal while the microcontroller unit is turning off the power switch in response to the fault signal.

* * * * *